United States Patent
Ye

(10) Patent No.: US 11,287,504 B2
(45) Date of Patent: Mar. 29, 2022

(54) SYSTEMS AND METHODS FOR MAGNETIC RESONANCE IMAGING

(71) Applicant: UIH AMERICA, INC., Houston, TX (US)

(72) Inventor: Yongquan Ye, Houston, TX (US)

(73) Assignee: UIH AMERICA, INC., Houston, TX (US)

( * ) Notice: Subject to any disclaimer, the term of this patent is extended or adjusted under 35 U.S.C. 154(b) by 0 days.

(21) Appl. No.: 16/989,905

(22) Filed: Aug. 11, 2020

(65) Prior Publication Data
US 2020/0371184 A1    Nov. 26, 2020

(51) Int. Cl.
*G01R 33/56* (2006.01)
*G01R 33/24* (2006.01)

(52) U.S. Cl.
CPC ....... *G01R 33/5602* (2013.01); *G01R 33/246* (2013.01); *G01R 33/5608* (2013.01)

(58) Field of Classification Search
CPC .............. G01R 33/246; G01R 33/5602; G01R 33/5608
See application file for complete search history.

(56) References Cited

U.S. PATENT DOCUMENTS

| | | | |
|---|---|---|---|
| 2017/0154419 A1* | 6/2017 | Shiroishi | G06T 11/006 |
| 2018/0275235 A1* | 9/2018 | Reeder | G01R 33/543 |
| 2019/0079154 A1* | 3/2019 | Du | G01R 33/5602 |

OTHER PUBLICATIONS

Deoni, S.C., High-Resolution T1 Mapping of the Brain at 3T with Driven Equilibrium Single Pulse Observation of T1 with High-speed Incorporation of RF Field Inhomogeneities (DESPOT1-HIFI), Journal of Magnetic Resonance Imaging, 26(4): 1106-1111, 2007.

Bloch, F. et al., Magnetic Resonance for Nonrotating Fields, Physical Review, 57(6): 522-527, 1940.

Yarnykh V.L., Actual Flip-Angle Imaging in the Pulsed Steady State: a Method for Rapid Three-Dimensional Mapping of the Transmitted Radiofrequency Field, Magnetic Resonance in Medicine, 57(1): 192-200, 2007.

Wang, Yu et al., Strategically Acquired Gradient Echo (STAGE) Imaging, Part II: Correcting for RF Inhomogeneities in Estimating T1 and Proton Density, Magnetic Resonance Imaging, 46: 140-150, 2018.

* cited by examiner

*Primary Examiner* — Gregory H Curran
(74) *Attorney, Agent, or Firm* — Metis IP LLC

(57) ABSTRACT

An MRI system is provided. The system may obtain a first set of MRI data relating to a subject acquired by an MR scanner in a first acquisition when the subject reaches a first T1 weighting level, and obtain a second set of MRI data relating to the subject acquired by the MR scanner in a second acquisition when the subject reaches a second T1 weighting level different from the first T1 weighting level. The system may also determine a target value of a reference coefficient associated with a first B1 inhomogeneity in the first acquisition and a second B1 inhomogeneity in the second acquisition based on the first and second sets of MRI data.

18 Claims, 10 Drawing Sheets

600

```
┌─────────────────────────────────────────────────────────┐
│ Obtaining a first set of MRI data relating to a physical point │ ──── 601
│ acquired by an MR scanner in a first acquisition when the │
│ physical point reaches a first weighting level          │
└─────────────────────────────────────────────────────────┘
                            │
                            ▼
┌─────────────────────────────────────────────────────────┐
│ Obtaining a second set of MRI data relating to the physical point │ ──── 602
│ acquired by the MR scanner in a second acquisition when the │
│ physical point reaches a second weighting level different from │
│ the first weighting level                               │
└─────────────────────────────────────────────────────────┘
                            │
                            ▼
┌─────────────────────────────────────────────────────────┐
│ Determining, based on the first set of MRI data and the second │ ──── 603
│ set of MRI data, a target value of a reference coefficient │
│ associated with a first B1 inhomogeneity in the first acquisition │
│ and a second B1 inhomogeneity in the second acquisition │
└─────────────────────────────────────────────────────────┘
                            │
                            ▼
┌─ ─ ─ ─ ─ ─ ─ ─ ─ ─ ─ ─ ─ ─ ─ ─ ─ ─ ─ ─ ─ ─ ─ ─ ─ ─ ─ ─ ─ ┐
│ Determining, based at least in part on the target value of the │ ──── 604
│ reference coefficient, a T1 value of the physical point │
└─ ─ ─ ─ ─ ─ ─ ─ ─ ─ ─ ─ ─ ─ ─ ─ ─ ─ ─ ─ ─ ─ ─ ─ ─ ─ ─ ─ ─ ┘
```

Determining, based on one or more first values and one or more second values of one or more pulse sequence parameters, a reference value of the reference coefficient — 701

Determining, based on the reference value and the target value of the reference coefficient, a correction coefficient with respect to T1 measurement — 702

Determining, based at least in part on the correction coefficient, the T1 value of the physical point — 703

FIG. 7

SYSTEMS AND METHODS FOR MAGNETIC RESONANCE IMAGING

TECHNICAL FIELD

The present disclosure generally relates to magnetic resonance imaging (MRI), and more particularly, methods and systems for quantitative measurement in MRI.

BACKGROUND

MRI systems are widely used in medical diagnosis and/or treatment by exploiting a powerful magnetic field and radio frequency (RF) techniques. For example, via MRI systems, various measurements, such as a longitudinal relaxation time (T1) measurement, a transverse relaxation time (T2) measurement, a proton density (PD) measurement, may be performed on a subject to provide a basis for the disease diagnosis and/or treatment.

SUMMARY

According to one aspect of the present disclosure, a system for MRI is provided. The system may include at least one storage device including a set of instructions, and at least one processor configured to communicate with the at least one storage device. When executing the instructions, the at least one processor may be configured to direct the system to perform the following operations. The at least one processor may be configured to direct the system to obtain a first set of MRI data relating to a subject acquired by an MR scanner in a first acquisition when the subject reaches a first T1 weighting level, and obtain a second set of MRI data relating to the subject acquired by the MR scanner in a second acquisition when the subject reaches a second T1 weighting level different from the first T1 weighting level. The first acquisition may be applied according to one or more first values each of which corresponds to one of one or more pulse sequence parameters. The second acquisition may be applied according to one or more second values each of which corresponds to one of the one or more pulse sequence parameters. The first value and the second value of at least one of the one or more pulse sequence parameters may be different. The at least one processor may be configured to direct the system to determine a target value of a reference coefficient associated with a first B1 inhomogeneity in the first acquisition and a second B1 inhomogeneity in the second acquisition based on the first set of MRI data and the second set of MRI data.

In some embodiments, the subject may be a physical point of an object, and the reference coefficient may measure a difference between a first signal intensity at the physical point during the first acquisition and a second signal intensity at the physical point during the second acquisition.

In some embodiments, the reference coefficient may be a ratio of the first signal intensity to the second signal intensity or a ratio of the second signal intensity to the first signal intensity.

In some embodiments, the first set of MRI data and the second set of MRI data may be acquired in an MRI scan of the object. The determining a target value of a reference coefficient associated with a first B1 inhomogeneity in the first acquisition and a second B1 inhomogeneity in the second acquisition based on the first set of MRI data and the second set of MRI data may further include reconstructing a first image of the object based on the first set of MRI data, reconstructing a second image of the object based on the second set of MRI data, and determining the target value of the reference coefficient based on the first image and the second image.

In some embodiments, the determining the target value of the reference coefficient based on the first image and the second image may include identifying, in the first image, a first element corresponding to the physical point, identifying, in the second image, a second element corresponding to the physical point, and determining the target value of the reference coefficient based on a value of the first element to a value of the second element.

In some embodiments, the operations may further include determining a T1 value of the subject based at least in part on the target value of the reference coefficient.

In some embodiments, the determining a T1 value of the subject based at least in part on the target value of the reference coefficient may include determining a reference value of the reference coefficient based on the one or more first values and the one or more second values of the one or more pulse sequence parameters, determining a correction coefficient with respect to T1 measurement based on the reference value and the target value of the reference coefficient, and determining the T1 value of the subject based at least in part on the correction coefficient.

In some embodiments, the one or more first values of the one or more pulse sequence parameters include a first flip angle, and the one or more second values of the one or more pulse sequence parameters include a second flip angle different from the first flip angle.

In some embodiments, the determining the T1 value of the subject based at least in part on the correction coefficient may include determining a preliminary T1 value of the subject based on the first flip angle, the second flip angle, and the reference value of the reference coefficient, and determining the T1 value of the subject by correcting the preliminary T1 value according to the correction coefficient.

In some embodiments, the determining the T1 value of the subject based at least in part on the correction coefficient may include determining a corrected first flip angle by correcting the first flip angle according to the correction coefficient, and determining the T1 value of the subject based on the corrected first flip angle, the second flip angle, and the target value of the reference coefficient.

In some embodiments, the determining a T1 value of the subject based at least in part on the target value of the reference coefficient may be performed according to an analytic solution or a driven equilibrium single pulse observation (DESPOT) algorithm.

According to another aspect of the present disclosure, a method for MRI is provided. The method may include obtaining a first set of MRI data relating to a subject acquired by an MR scanner in a first acquisition when the subject reaches a first T1 weighting level, and obtaining a second set of MRI data relating to the subject acquired by the MR scanner in a second acquisition when the subject reaches a second T1 weighting level different from the first T1 weighting level. The first acquisition may be applied according to one or more first values each of which corresponds to one of one or more pulse sequence parameters. The second acquisition may be applied according to one or more second values each of which corresponds to one of the one or more pulse sequence parameters. The first value and the second value of at least one of the one or more pulse sequence parameters may be different. The method may further include determining a target value of a reference coefficient associated with a first B1 inhomogeneity in the first acquisition and a second B1 inhomogeneity in the second acquisition based on the first set of MRI data and the second set of MRI data.

According to another aspect of the present disclosure, a non-transitory computer readable medium is provided. The non-transitory computer readable medium may comprise a set of instructions for MRI, wherein when executed by at least one processor, the set of instructions may direct the at least one processor to effectuate a method. The method may include obtaining a first set of MRI data relating to a subject acquired by an MR scanner in a first acquisition when the subject reaches a first T1 weighting level, and obtaining a second set of MRI data relating to the subject acquired by the MR scanner in a second acquisition when the subject reaches a second T1 weighting level different from the first T1 weighting level. The first acquisition may be applied according to one or more first values each of which corresponds to one of one or more pulse sequence parameters. The second acquisition may be applied according to one or more second values each of which corresponds to one of the one or more pulse sequence parameters. The first value and the second value of at least one of the one or more pulse sequence parameters may be different. The method may further include determining a target value of a reference coefficient associated with a first B1 inhomogeneity in the first acquisition and a second B1 inhomogeneity in the second acquisition based on the first set of MRI data and the second set of MRI data.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities, and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. These embodiments are non-limiting exemplary embodiments, in which like reference numerals represent similar structures throughout the several views of the drawings, and wherein:

FIG. 6 is a flowchart illustrating an exemplary process for determining a T1 value of a subject according to some embodiments of the present disclosure;

FIG. 7 is a flowchart illustrating an exemplary process for determining a T1 value of a physical point based at least in part on a target value of a reference coefficient according to some embodiments of the present disclosure;

DETAILED DESCRIPTION

In the following detailed description, numerous specific details are set forth by way of examples in order to provide a thorough understanding of the relevant disclosure. However, it should be apparent to those skilled in the art that the present disclosure may be practiced without such details. In other instances, well-known methods, procedures, systems, components, and/or circuitry have been described at a relatively high-level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

The terminology used herein is for the purpose of describing particular example embodiments only and is not intended to be limiting. As used herein, the singular forms "a," "an," and "the" may be intended to include the plural forms as well, unless the context clearly indicates otherwise. It will be further understood that the terms "comprise," "comprises," and/or "comprising," "include," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that the term "system," "device," "unit," "module," and/or "block" used herein are one method to distinguish different components, elements, parts, sections or assembly of different levels in ascending order. However, the terms may be displaced by another expression if they achieve the same purpose.

Figure 3:
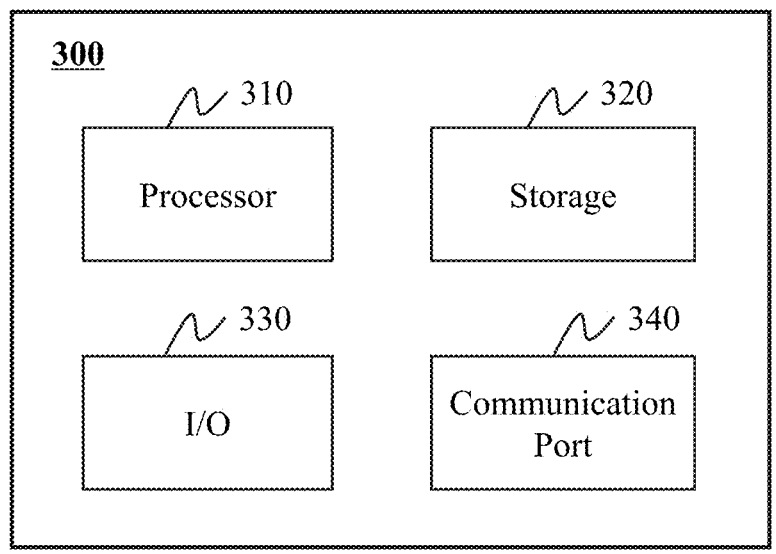
FIG. 3 is a schematic diagram illustrating exemplary hardware and/or software components of a computing device according to some embodiments of the present disclosure.

Generally, the word "module," "unit," or "block," as used herein, refers to logic embodied in hardware or firmware, or to a collection of software instructions. A module, a unit, or a block described herein may be implemented as software and/or hardware and may be stored in any type of non-transitory computer-readable medium or another storage device. In some embodiments, a software module/unit/block may be compiled and linked into an executable program. It will be appreciated that software modules can be callable from other modules/units/blocks or themselves, and/or may be invoked in response to detected events or interrupts. Software modules/units/blocks configured for execution on computing devices (e.g., processor 310 as illustrated in FIG. 3) may be provided on a computer-readable medium, such as a compact disc, a digital video disc, a flash drive, a magnetic disc, or any other tangible medium, or as a digital download (and can be originally stored in a compressed or installable format that needs installation, decompression, or decryption prior to execution). Such software code may be stored, partially or fully, on a storage device of the executing computing device, for execution by the computing device. Software instructions may be embedded in firmware, such as an EPROM. It will be further appreciated that hardware modules/units/blocks may be included in connected logic components, such as gates and flip-flops, and/or can be included of programmable units, such as programmable gate arrays or processors. The modules/units/blocks or computing device functionality described herein may be implemented as software modules/units/blocks but may be represented in hardware or firmware. In general, the modules/units/blocks described herein refer to logical modules/units/blocks that may be combined with other modules/units/blocks or divided into sub-modules/sub-units/sub-blocks despite their physical organization or storage. The description may apply to a system, a device, or a portion thereof.

It will be understood that when a unit, device, module or block is referred to as being "on," "connected to," or "coupled to," another unit, device, module, or block, it may be directly on, connected or coupled to, or communicate with the other unit, device, module, or block, or an intervening unit, device, module, or block may be present, unless the context clearly indicates otherwise. As used herein, the term "and/or" includes any and all combinations of one or more of the associated listed items. The term "pixel" and "voxel" in the present disclosure are used interchangeably to refer to an element in an image. The term "image" in the present disclosure is used to refer to images of various forms, including a 2-dimensional image, a 3-dimensional image, a 4-dimensional image, etc.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

The flowcharts used in the present disclosure illustrate operations that systems implement according to some embodiments of the present disclosure. It is to be expressly understood the operations of the flowcharts may be implemented not in order. Conversely, the operations may be implemented in inverted order, or simultaneously. Moreover, one or more other operations may be added to the flowcharts. One or more operations may be removed from the flowcharts.

Moreover, while the systems and methods disclosed in the present disclosure are described primarily regarding performing a measurement on a subject (e.g., a patient, a physical point of the patient) in an MRI system. It should be understood that this is only for illustration purposes. The systems and methods of the present disclosure may be applied to any other kind of medical imaging system. In some embodiments, the imaging system may include a single modality imaging system and/or a multi-modality imaging system. The single modality imaging system may include, for example, the MRI system. The multi-modality imaging system may include, for example, a computed tomography-magnetic resonance imaging (MRI-CT) system, a positron emission tomography-magnetic resonance imaging (PET-MRI) system, a single photon emission computed tomography-magnetic resonance imaging (SPECT-MRI) system, a digital subtraction angiography-magnetic resonance imaging (DSA-MRI) system, etc.

An aspect of the present disclosure relates to systems and methods for quantitative measurement in MRI. For illustration purposes, the present disclosure is described with reference to the implementation of T1 measurement on a subject in MRI. The subject may be biological or non-biological. For example, the subject may include a patient, a man-made object, etc. As another example, the subject may include a specific portion, organ, tissue, and/or a physical point of the patient. For example, the subject may include head, brain, neck, body, shoulder, arm, thorax, cardiac, stomach, blood vessel, soft tissue, knee, feet, or the like, or a combination thereof. In some embodiments, the subject may be a physical point of an object (e.g., a patient). As used herein, a physical point of an object refers to a portion, such as a point or a region of the object having physical properties (e.g., weight, inertia, momentum, etc.). In some embodiments, a physical point of the object may correspond to a pixel or voxel in an MRI image of the object generated via an MRI scan of the object. It should be noted that this is not intended to be limiting, and the systems and methods may be applied to perform other quantitative measurements (e.g., a T2 measurement) on a subject.

Conventionally, to determine a T1 value of a physical point of an object, a magnetization recovery pulse sequence (e.g., an inversion recovery pulse sequence, a saturation recovery pulse sequence) may be applied to the object by an MR scanner to acquire echo signal(s) from the object, and a T1 value of the physical point may be determined by correlating the signal intensity of the echo signal(s) with the T1 relaxation effect. Another approach for T1 measurement may be performed by applying a plurality acquisitions with different pulse sequence parameter values (e.g., different flip angles (FAs) or different repetition times) to the object using the MR scanner. A plurality of sets of MRI data may be acquired in the plurality of acquisitions when the physical point reaches different T1 weighting levels. Because that the T1 value of the physical point may affect the sets of MRI data corresponding to the different pulse sequence parameter values, the T1 value of the subject may be determined based on the sets of MRI data. However, the implementation of the acquisitions may be affected by various factors, such as, the hardware limitation of the MR scanner, a wavelength of a B0 field (i.e., a main magnetic field), a wavelength of a B1 field (i.e., a radiofrequency field), a dielectric property and a conductivity property of the object, and the like.

Due to these factors, in an acquisition, an actual B1 field applied to the physical point may deviate from a predetermined B1 field of the acquisition. In addition, the actual B1 field may have an inhomogeneous spatial distribution (i.e., the actual B1 field may have different values at different physical points of the object), which is referred to as a B1 inhomogeneity. The B1 inhomogeneity may result in a discrepancy between an actual FA at the physical point and a preset FA of the acquisition, which may affect the set of MRI data acquired in the acquisition and the accuracy of the T1 measurement performed based on the set of MRI data. The T1 measurement may need to take the B1 inhomogeneity in the acquisitions into consideration. For example, conventional T1 measurement approaches may determine the actual B1 field (or an actual FA or a ratio of the actual FA to the preset FA) at the physical point during each acquisition, and determine an adjusted T1 value of the physical point based on the actual B1 fields in the acquisitions. Usually, the conventional T1 measurement approaches assume that the B1 inhomogeneity is consistent for different acquisitions, for example, by using a same correction coefficient to determine the actual FAs in different acquisitions. However, different acquisitions may have different B1 inhomogeneity, and the determined actual B1 field in each acquisition may be merely an estimated value. The T1 value determined according to this assumption may have a low signal-to-noise ratio (SNR). It is desirable to provide systems and methods for T1 measurement by taking the different B1 inhomogeneity in different acquisitions into consideration, thereby improving the accuracy of the T1 measurement.

According to some embodiments of the present disclosure, the systems and methods may obtain a first set of MRI data relating to a subject acquired by an MR scanner in a first acquisition when the subject reaches a first T1 weighting level. The first acquisition may be applied according to one or more first values, each of which corresponds to one of one or more pulse sequence parameters. The systems and methods may also obtain a second set of MRI data relating to the subject acquired by the MR scanner in a second acquisition when the subject reaches a second T1 weighting level different from the first T1 weighting level. The second acquisition may be applied according to one or more second values, each of which corresponds to one of the one or more pulse sequence parameters. The first value and the second value of at least one of the one or more pulse sequence parameters may be different. The systems and methods may further determine a target value of a reference coefficient associated with a first B1 inhomogeneity in the first acquisition and a second B1 inhomogeneity in the second acquisition based on the first set of MRI data and the second set of MRI data.

In some embodiments, the systems and methods may further determine a quantitative parameter, such as a T1 value of the subject based on the target value of the reference coefficient. The target value of the reference coefficient may be used to eliminate or reduce the effect of the first and second B1 inhomogeneity in the determination of the T1 value of the subject. Compared with conventional T1 measurement approaches, the systems and methods may take both the first and second B1 inhomogeneity into consideration, which may improve the accuracy and reliability of T1 measurement.

Figure 1:
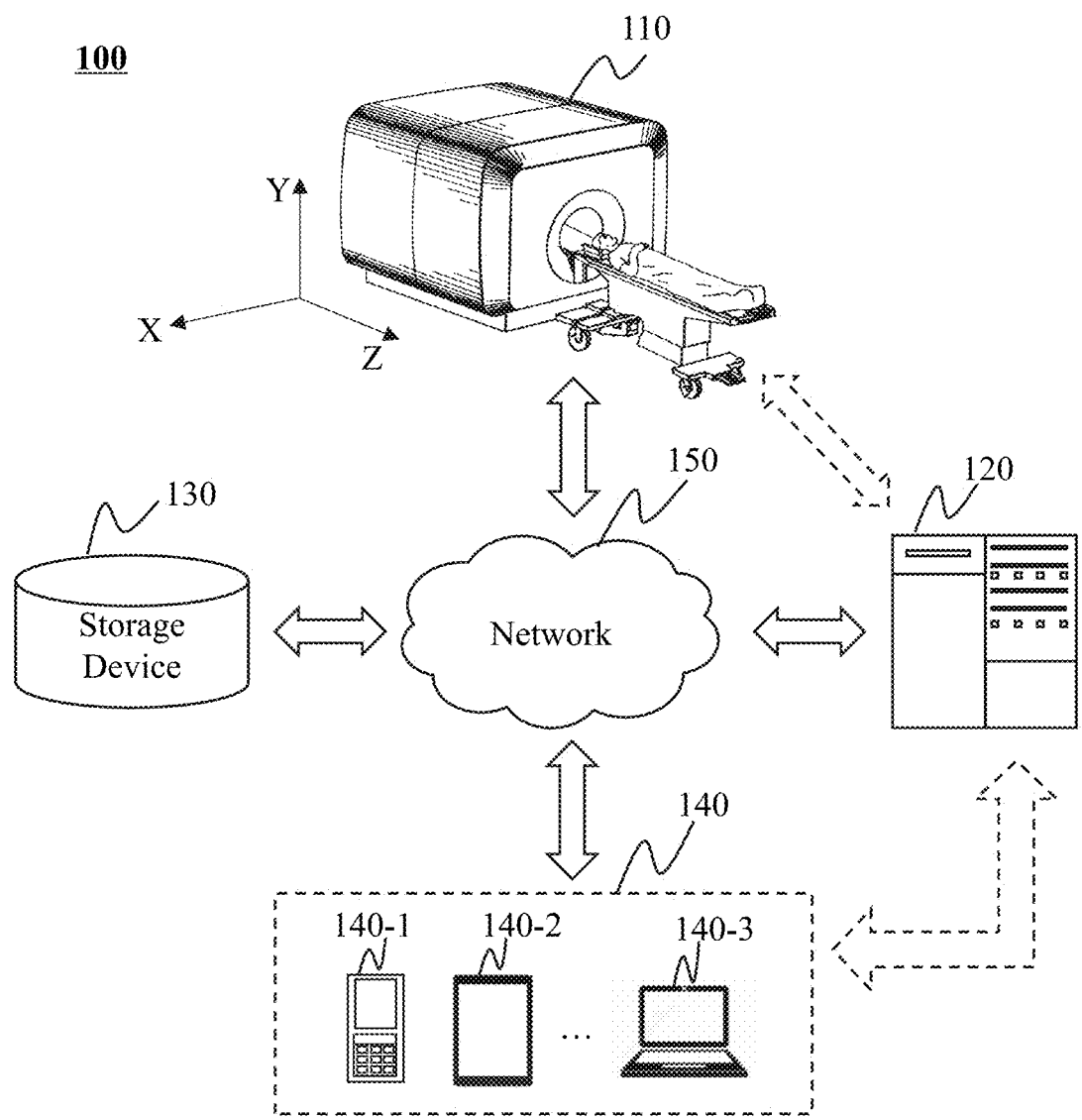
FIG. 1 is a schematic diagram illustrating an exemplary MRI system according to some embodiments of the present disclosure.

FIG. 1 is a schematic diagram illustrating an exemplary MRI system 100 according to some embodiments of the present disclosure. As shown in FIG. 1, the MRI system 100 may include an MR scanner 110, a processing device 120, a storage device 130, one or more terminals 140, and a network 150. In some embodiments, the MR scanner 110, the processing device 120, the storage device 130, and/or the terminal(s) 140 may be connected to and/or communicate with each other via a wireless connection, a wired connection, or a combination thereof. The connections between the components in the MRI system 100 may be variable. For example, the MR scanner 110 may be connected to the processing device 120 through the network 150. As another example, the MR scanner 110 may be connected to the processing device 120 directly.

The MR scanner 110 may be configured to scan a subject (or a part of the subject) to acquire image data, such as echo signals (or MRI data) associated with the subject. For example, the MR scanner 110 may detect a plurality of sets of MRI data by applying an MR pulse sequence on the subject. In some embodiments, the MR scanner 110 may include, for example, a magnetic body, a gradient coil, an RF coil, etc., as described in connection with FIG. 2. In some embodiments, the MR scanner 110 may be a permanent magnet MR scanner, a superconducting electromagnet MR scanner, or a resistive electromagnet MR scanner, etc., according to types of the magnetic body. In some embodiments, the MR scanner 110 may be a high-field MR scanner, a mid-field MR scanner, and a low-field MR scanner, etc., according to the intensity of the magnetic field.

For illustration purposes, a coordinate system including an X-axis, a Y-axis, and a Z-axis is provided in FIG. 1. The X-axis and the Z-axis shown in FIG. 1 may be horizontal, and the Y-axis may be vertical. As illustrated, the positive X direction along the X-axis may be from the right side to the left side of the MR scanner 110 seen from the direction facing the front of the MR scanner 110; the positive Y direction along the Y-axis shown in FIG. 1 may be from the lower part to the upper part of the MR scanner 110; the positive Z direction along the Z-axis shown in FIG. 1 may refer to a direction in which the subject is moved out of the scanning channel (or referred to as the bore) of the MR scanner 110. More description of the MR scanner 110 may be found elsewhere in the present disclosure. See, e.g., FIG. 2 and the description thereof.

The processing device 120 may process data and/or information obtained from the MR scanner 110, the storage device 130, and/or the terminal(s) 140. For example, the processing device 120 may determine a target value of a reference coefficient by processing image data (e.g., MRI data) relating to a subject collected by the MR scanner 110, wherein the reference coefficient may be associated with the B1 inhomogeneity in a plurality of acquisitions. As another example, the processing device 120 may perform a T1 measurement on the subject based on at least in part on the target value of the reference coefficient. In some embodiments, the processing device 120 may be a single server or a server group. The server group may be centralized or distributed. In some embodiments, the processing device 120 may be local or remote. For example, the processing device 120 may access information and/or data from the MR scanner 110, the storage device 130, and/or the terminal(s) 140 via the network 150. As another example, the processing device 120 may be directly connected to the MR scanner 110, the terminal(s) 140, and/or the storage device 130 to access information and/or data. In some embodiments, the processing device 120 may be implemented on a cloud platform. For example, the cloud platform may include a private cloud, a public cloud, a hybrid cloud, a community cloud, a distributed cloud, an inter-cloud, a multi-cloud, or the like, or a combination thereof. In some embodiments, the processing device 120 may be implemented by a computing device 300 having one or more components as described in connection with FIG. 3.

The storage device 130 may store data, instructions, and/or any other information. In some embodiments, the storage device 130 may store data obtained from the MR scanner 110, the processing device 120, and/or the terminal(s) 140. In some embodiments, the storage device 130 may store data and/or instructions that the processing device 120 may execute or use to perform exemplary methods described in the present disclosure. In some embodiments, the storage device 130 may include a mass storage device, a removable storage device, a volatile read-and-write memory, a read-only memory (ROM), or the like, or a combination thereof. Exemplary mass storage devices may include a magnetic disk, an optical disk, a solid-state drive, etc. Exemplary removable storage devices may include a flash drive, a floppy disk, an optical disk, a memory card, a zip disk, a magnetic tape, etc. Exemplary volatile read-and-write memory may include a random access memory (RAM).

Exemplary RAM may include a dynamic RAM (DRAM), a double date rate synchronous dynamic RAM (DDR SDRAM), a static RAM (SRAM), a thyristor RAM (T-RAM), a zero-capacitor RAM (Z-RAM), etc. Exemplary ROM may include a mask ROM (MROM), a programmable ROM (PROM), an erasable programmable ROM (EPROM), an electrically erasable programmable ROM (EEPROM), a compact disk ROM (CD-ROM), a digital versatile disk ROM, etc. In some embodiments, the storage device 130 may be implemented on a cloud platform as described elsewhere in the disclosure.

In some embodiments, the storage device 130 may be connected to the network 150 to communicate with one or more other components in the MRI system 100 (e.g., the MR scanner 110, the processing device 120, and/or the terminal(s) 140). One or more components of the MRI system 100 may access the data or instructions stored in the storage device 130 via the network 150. In some embodiments, the storage device 130 may be part of the processing device 120 or the terminal(s) 140.

The terminal(s) 140 may be configured to enable a user interaction between a user and the MRI system 100. For example, the terminal(s) 140 may receive an instruction to cause the MR scanner 110 to scan the subject from the user. As another example, the terminal(s) 140 may receive a processing result (e.g., a measurement result, such as a value of a quantitative parameter or a quantitative map relating to the subject) from the processing device 120 and display the processing result to the user. In some embodiments, the terminal(s) 140 may be connected to and/or communicate with the MR scanner 110, the processing device 120, and/or the storage device 130. In some embodiments, the terminal(s) 140 may include a mobile device 140-1, a tablet computer 140-2, a laptop computer 140-3, or the like, or a combination thereof. For example, the mobile device 140-1 may include a mobile phone, a personal digital assistant (PDA), a gaming device, a navigation device, a point of sale (POS) device, a laptop, a tablet computer, a desktop, or the like, or a combination thereof. In some embodiments, the terminal(s) 140 may include an input device, an output device, etc. The input device may include alphanumeric and other keys that may be input via a keyboard, a touch screen (for example, with haptics or tactile feedback), a speech input, an eye tracking input, a brain monitoring system, or any other comparable input mechanism. The input information received through the input device may be transmitted to the processing device 120 via, for example, a bus, for further processing. Other types of the input device may include a cursor control device, such as a mouse, a trackball, or cursor direction keys, etc. The output device may include a display, a speaker, a printer, or the like, or a combination thereof. In some embodiments, the terminal(s) 140 may be part of the processing device 120 or the MR scanner 110.

The network 150 may include any suitable network that can facilitate the exchange of information and/or data for the MRI system 100. In some embodiments, one or more components of the MRI system 100 (e.g., the MR scanner 110, the processing device 120, the storage device 130, the terminal(s) 140, etc.) may communicate information and/or data with one or more other components of the MRI system 100 via the network 150. For example, the processing device 120 may obtain image data (e.g., an echo signal) from the MR scanner 110 via the network 150. As another example, the processing device 120 may obtain user instructions from the terminal(s) 140 via the network 150. The network 150 may include a public network (e.g., the Internet), a private network (e.g., a local area network (LAN), a wide area network (WAN)), etc.), a wired network (e.g., an Ethernet network), a wireless network (e.g., an 802.11 network, a Wi-Fi network, etc.), a cellular network (e.g., a Long Term Evolution (LTE) network), a frame relay network, a virtual private network ("VPN"), a satellite network, a telephone network, routers, hubs, switches, server computers, or the like, or a combination thereof. For example, the network 150 may include a cable network, a wireline network, a fiber-optic network, a telecommunications network, an intranet, a wireless local area network (WLAN), a metropolitan area network (MAN), a public telephone switched network (PSTN), a Bluetooth™ network, a ZigBee™ network, a near field communication (NFC) network, or the like, or a combination thereof. In some embodiments, the network 150 may include one or more network access points. For example, the network 150 may include wired and/or wireless network access points such as base stations and/or internet exchange points through which one or more components of the MRI system 100 may be connected to the network 150 to exchange data and/or information.

This description is intended to be illustrative, and not to limit the scope of the present disclosure. Many alternatives, modifications, and variations will be apparent to those skilled in the art. The features, structures, methods, and characteristics of the exemplary embodiments described herein may be combined in various ways to obtain additional and/or alternative exemplary embodiments. In some embodiments, the MRI system 100 may include one or more additional components and/or one or more components described above may be omitted. Additionally or alternatively, two or more components of the MRI system 100 may be integrated into a single component. For example, the processing device 120 may be integrated into the MR scanner 110. As another example, a component of the MRI system 100 may be replaced by another component that can implement the functions of the component. In some embodiments, the storage device 130 may be a data storage including cloud computing platforms, such as a public cloud, a private cloud, a community and hybrid cloud, etc. However, those variations and modifications do not depart the scope of the present disclosure.

Figure 2:
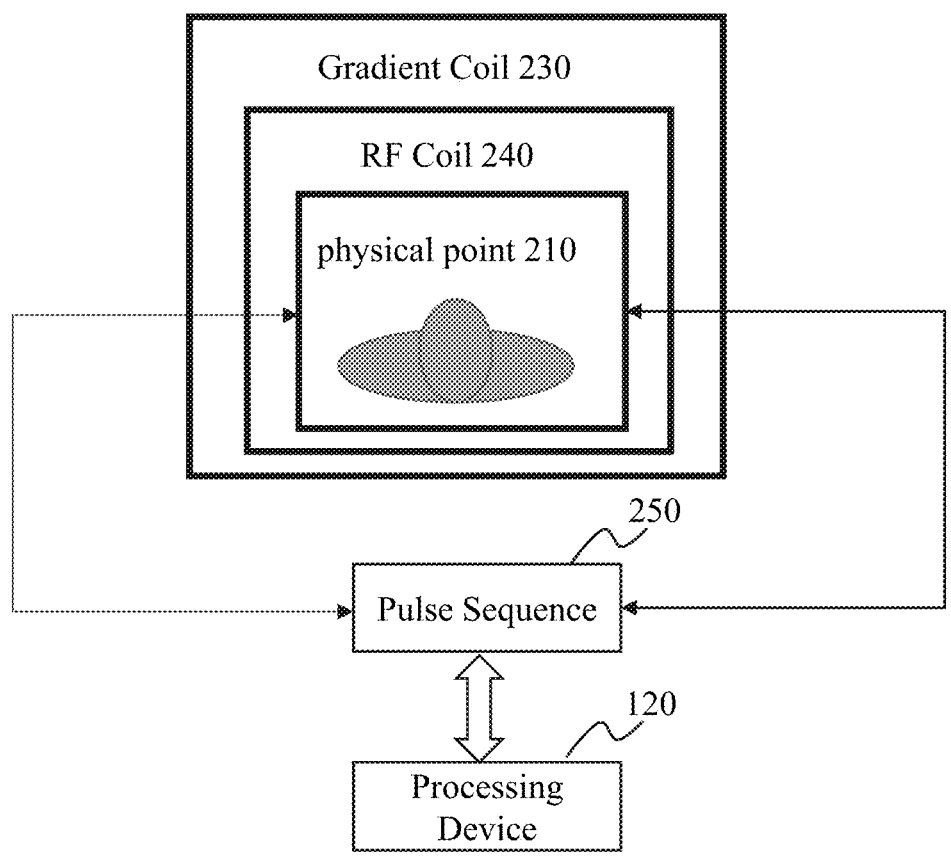
FIG. 2 is a block diagram illustrating an exemplary MR scanner according to some embodiments of the present disclosure.

FIG. 2 is a block diagram illustrating an exemplary MR scanner 110 according to some embodiments of the present disclosure. As illustrated in FIG. 2, the MR scanner 110 may include a magnetic body 220, a gradient coil 230, an RF coil 240, and a pulse sequence module 250.

The magnetic body 220 may generate a static magnetic field during the scanning of at least a portion of a subject 210. The magnetic body 220 may be of various types including, for example, a permanent magnet, a superconducting electromagnet, a resistive electromagnet, etc.

The gradient coil 230 may provide magnetic field gradients to the main magnetic field in an X direction, a Y direction, and/or a Z direction. As used herein, the X direction, the Y direction, and the Z direction may represent an X-axis, a Y-axis, and a Z-axis in a coordinate system (e.g., a same or similar coordinate system as that described in FIG. 1). For example, the Z-axis may be along the axis of the magnetic body 220, the X-axis and the Z-axis may form a horizontal plane, and the X-axis and the Y-axis may form a vertical plane. In some embodiments, the gradient coil 230 may include an X-direction coil for providing a magnetic field gradient to the main magnetic field in the X direction, a Y-direction coil for providing a magnetic field gradient to the main magnetic field in the Y direction, and/or Z-direction coil for providing a magnetic field gradient to the main magnetic field in the Z direction. In some embodiments, the X-direction coil, the Y-direction coil, and/or the Z-direction coil may be of various shape or configuration. For example, the Z-direction coil may be designed based on a circular (Maxwell) coil. As another example, the X-direction coil and the Y-direction coil may be designed on the basis of a saddle (Golay) coil configuration.

The RF coil 240 may emit RF pulse signals to and/or receive echo signals from the subject 210 being examined. In some embodiments, the RF coil 240 may include a transmitting coil and a receiving coil. The transmitting coil may emit signals (e.g., RF pulses) that may excite a nucleus in the subject 210 to provide a resonation. The receiving coil may receive echo signals emitted from the subject 210. In some embodiments, the RF transmitting coil and the RF receiving coil may be integrated into one same coil. In some embodiments, the RF coil 240 may be of various types including, for example, a quadrature detection (QD) orthogonal coil, a phased-array coil, a specific element spectrum coil, etc. In some embodiments, the RF coil 240 may be a phased-array coil that includes multiple coil units, each of which may detect echo signals independently.

In some embodiments, the RF coil 240 may be used to detect signals generated by an MR pulse sequence. The MR pulse sequence may be of various types, such as a spin echo (SE) pulse sequence, a GRE pulse sequence, an inversion recovery (IR) pulse sequence, a multi-echo MR pulse sequence, a T1ρ-prepared pulse sequence, a T2-prepared pulse sequence, a diffusion-weighted imaging (DWI) pulse sequence, a saturation recovery (SR) pulse sequence, a steady-state pulse sequence, etc.

In some embodiments, the MR pulse sequence may be defined by one or more pulse sequence parameters including, for example, the type of the MR pulse sequence, a time for applying the MR pulse sequence, a duration of the MR pulse sequence, a flip angle of an excitation pulse in the MR pulse sequence, a count (or number) of RF pulses in the MR pulse sequence, a TR, a repetition count, an inversion time (TI), a count (or number) of acquisitions in the MR pulse sequence, a b-value, a T1ρ-preparation duration, a T2-preparation duration, an echo train length, an echo spacing, a velocity encoding (VENC) value, etc. As used herein, an FA of an excitation pulse may refer to the rotation of the net magnetization vector by the excitation pulse relative to the main magnetic field. The TR may refer to the timespan between two repeating and consecutive RF pulses in an MR pulse sequence (e.g., the timespan between two consecutive excitation RF pulses in an SE pulse sequence, the timespan between two consecutive 180° inversion pulses in an IR pulse sequence). The repetition count may refer to the count (or number) of repetitions in an MR pulse sequence. The TI may refer to the timespan between a 180° inversion pulse and a following 90° excitation pulse in an IR pulse sequence. The b-value may refer to a factor that reflects the strength and timing of diffusion-sensitizing gradients in a DWI pulse sequence. The T1ρ-preparation duration may refer to the duration of a spin-lock pulse in a T1ρ-prepared pulse sequence. The T2-preparation duration may refer to the duration of a T2 preparation pulse in a T2-prepared pulse sequence.

In some embodiments, the RF coil 240 may detect (or receive) one or more echo signals corresponding to one or more echoes excited by the MR pulse sequence. In some embodiments, an echo signal (or an echo) may be defined by one or more parameters, for example, an echo signal type (a spin echo, a fast spin echo (FSE), a fast recovery FSE, a single shot FSE, a gradient recalled echo, a fast imaging with steady-state precession), an echo time (TE), an echo signal intensity, a coil unit (e.g., denoted by an identification (ID) or a serial number of the coil unit) that detects the echo signal, a repetition (e.g., denoted by a repetition serial number) in which the echo signal is detected, an acquisition (e.g., denoted by an acquisition serial number) in which the echo signal is detected, etc. The TE may refer to the time between an application of an excitation RF pulse and the peak of an echo excited by the excitation RF pulse.

The pulse sequence module 250 may be configured to define parameters and arrangements relating to the MR scanner 110 before and/or during the scan of the subject 210. In some embodiments, the parameters relating to the MR scanner 110 may include one or more parameters relating to an MR pulse sequence (e.g., the type of the MR pulse sequence, a TR, a repetition count, a TI, etc.) applied by the MR scanner 110, one or more parameters relating to a gradient field generated by the gradients coil 230 or a radiofrequency field (e.g. an RF center frequency, a flip angle), one or more parameters relating to echo signals (e.g., a TE, a spin echo type) detected by the RF coil 240 as described elsewhere in the disclosure, or the like, or any combination thereof. In some embodiments, the parameters relating to the MR scanner 110 may include one or more other imaging parameters, such as, a count (or number) of RF channels, an image contrast and/or ratio, a slice thickness, an imaging type (e.g., a T1 weighted imaging, a T2 weighted imaging, a proton density weighted imaging, etc.), a field of view (FOV) of the MR scanner 110, an off-center frequency shift of the MR scanner 110, or the like, or a combination thereof.

In some embodiments, the pulse sequence module 250 may be connected to and/or communicate with the processing device 120. For example, before an MRI scanning process, at least one portion of the parameters and arrangements relating to the MR scanner 110 may be designed and/or determined by the processing device 120 according to clinical demands or a scanning protocol, and transmitted to the pulse sequence module 250. In an MR scanning process, the MR scanner 110 may scan the subject 210 based on the parameters and arrangements defined by the pulse sequence module 250. For example, the MR scanner 110 may apply an MR pulse sequence with specific parameters relating to MR pulse sequences defined by the pulse sequence module 250, and the RF coil 240 may receive echo signals according to specific parameters relating to echo signals defined by the pulse sequence module 250.

This description regarding the MR scanner 110 provided above is intended to be illustrative, and not to limit the scope of the present disclosure. Many alternatives, modifications, and variations will be apparent to those skilled in the art. The features, structures, methods, and characteristics of the exemplary embodiments described herein may be combined in various ways to obtain additional and/or alternative exemplary embodiments. For example, the pulse sequence module 250 may be integrated into the processing device 120. However, those variations and modifications do not depart the scope of the present disclosure.

FIG. 3 is a schematic diagram illustrating exemplary hardware and/or software components of a computing device 300 according to some embodiments of the present disclosure. In some embodiments, one or more components of the MRI system 100 may be implemented on one or more components of the computing device 300. Merely by way of example, the processing device 120 and/or the terminal(s) 140 may be implemented one or more components of the computing device 300, respectively.

As illustrated in FIG. 3, the computing device 300 may include a processor 310, a storage device 320, an input/output (I/O) 330, and a communication port 340. The processor 310 may execute computer instructions (e.g., program code) and perform functions of the processing device 120 in accordance with techniques described herein. The computer instructions may include, for example, routines, programs, objects, components, data structures, procedures, modules, and functions, which perform particular functions described herein. For example, the processor 310 may process image data of a subject obtained from the MR scanner 110, the storage device 130, terminal(s) 140, and/or any other component of the MRI system 100. In some embodiments, the processor 310 may determine a T1 value of the subject based on MRI data relating to the subject acquired by the MR scanner 110.

In some embodiments, the processor 310 may include one or more hardware processors, such as a microcontroller, a microprocessor, a reduced instruction set computer (RISC), an application specific integrated circuits (ASICs), an application-specific instruction-set processor (ASIP), a central processing unit (CPU), a graphics processing unit (GPU), a physics processing unit (PPU), a microcontroller unit, a digital signal processor (DSP), a field programmable gate array (FPGA), an advanced RISC machine (ARM), a programmable logic device (PLD), any circuit or processor capable of executing one or more functions, or the like, or a combinations thereof.

Merely for illustration, only one processor is described in the computing device 300. However, it should be noted that the computing device 300 in the present disclosure may also include multiple processors. Thus operations and/or method steps that are performed by one processor as described in the present disclosure may also be jointly or separately performed by the multiple processors. For example, if in the present disclosure the processor of the computing device 300 executes both operation A and operation B, it should be understood that operation A and operation B may also be performed by two or more different processors jointly or separately in the computing device 300 (e.g., a first processor executes operation A and a second processor executes operation B, or the first and second processors jointly execute operations A and B).

The storage device 320 may store data/information obtained from the MR scanner 110, the storage device 130, the terminal(s) 140, and/or any other component of the MRI system 100. In some embodiments, the storage device 320 may include a mass storage device, a removable storage device, a volatile read-and-write memory, a read-only memory (ROM), or the like, or a combination thereof. For example, the mass storage device may include a magnetic disk, an optical disk, a solid-state drive, etc. The removable storage device may include a flash drive, a floppy disk, an optical disk, a memory card, a zip disk, a magnetic tape, etc. The volatile read-and-write memory may include a random access memory (RAM). The RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. The ROM may include a mask ROM (MROM), a programmable ROM (PROM), an erasable programmable ROM (EPROM), an electrically erasable programmable ROM (EEPROM), a compact disk ROM (CD-ROM), and a digital versatile disk ROM, etc. In some embodiments, the storage device 320 may store one or more programs and/or instructions to perform exemplary methods described in the present disclosure. For example, the storage device 320 may store a program for the processing device 120 for determining a T1 value of the subject.

The I/O 330 may input and/or output signals, data, information, etc. In some embodiments, the I/O 330 may enable a user interaction with the computing device 300 (e.g., the processing device 120). In some embodiments, the I/O 330 may include an input device and an output device. Examples of the input device may include a keyboard, a mouse, a touch screen, a microphone, or the like, or a combination thereof. Examples of the output device may include a display device, a loudspeaker, a printer, a projector, or the like, or a combination thereof. Examples of the display device may include a liquid crystal display (LCD), a light-emitting diode (LED)-based display, a flat panel display, a curved screen, a television device, a cathode ray tube (CRT), a touch screen, or the like, or a combination thereof.

The communication port 340 may be connected to a network (e.g., the network 150) to facilitate data communications. The communication port 340 may establish connections between the computing device 300 (e.g., the processing device 120) and one or more components of the MRI system 100 (e.g., the MR scanner 110, the storage device 130, and/or the terminal(s) 140). The connection may be a wired connection, a wireless connection, any other communication connection that can enable data transmission and/or reception, and/or a combination of these connections. The wired connection may include, for example, an electrical cable, an optical cable, a telephone wire, or the like, or a combination thereof. The wireless connection may include, for example, a Bluetooth™ link, a Wi-Fi™ link, a WiMax™ link, a WLAN link, a ZigBee link, a mobile network link (e.g., 3G, 4G, 5G, etc.), or the like, or a combination thereof. In some embodiments, the communication port 340 may be and/or include a standardized communication port, such as RS232, RS485, etc. In some embodiments, the communication port 340 may be a specially designed communication port. For example, the communication port 340 may be designed in accordance with the digital imaging and communications in medicine (DICOM) protocol.

Figure 4:
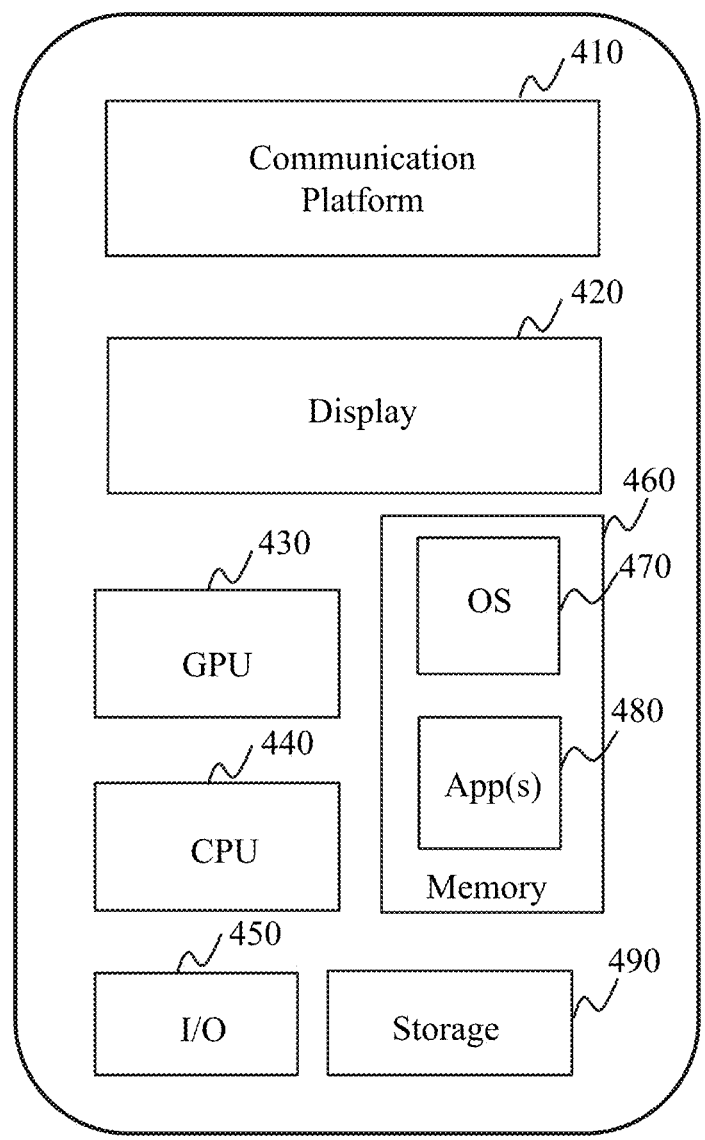
FIG. 4 is a schematic diagram illustrating exemplary hardware and/or software components of a mobile device according to some embodiments of the present disclosure.

FIG. 4 is a schematic diagram illustrating exemplary hardware and/or software components of a mobile device 400 may be implemented according to some embodiments of the present disclosure. In some embodiments, one or more components of the MRI system 100 may be implemented on one or more components of the mobile device 400. Merely by way of example, a terminal 140 may be implemented on one or more components of the mobile device 400.

As illustrated in FIG. 4, the mobile device 400 may include a communication platform 410, a display 420, a graphics processing unit (GPU) 430, a central processing unit (CPU) 440, an I/O 450, a memory 460, and a storage 490. In some embodiments, any other suitable component, including but not limited to a system bus or a controller (not shown), may also be included in the mobile device 400. In some embodiments, a mobile operating system 470 (e.g., iOS™, Android™, Windows Phone™, etc.) and one or more applications 480 may be loaded into the memory 460 from the storage 490 in order to be executed by the CPU 440. The applications 480 may include a browser or any other suitable mobile apps for receiving and rendering information relating to the MRI system 100. User interactions with the information stream may be achieved via the I/O 450 and provided to the processing device 120 and/or other components of the MRI system 100 via the network 150.

To implement various modules, units, and their functionalities described in the present disclosure, computer hardware platforms may be used as the hardware platform(s) for one or more of the elements described herein. A computer with user interface elements may be used to implement a personal computer (PC) or any other type of work station or terminal device. A computer may also act as a server if appropriately programmed.

Figure 5:
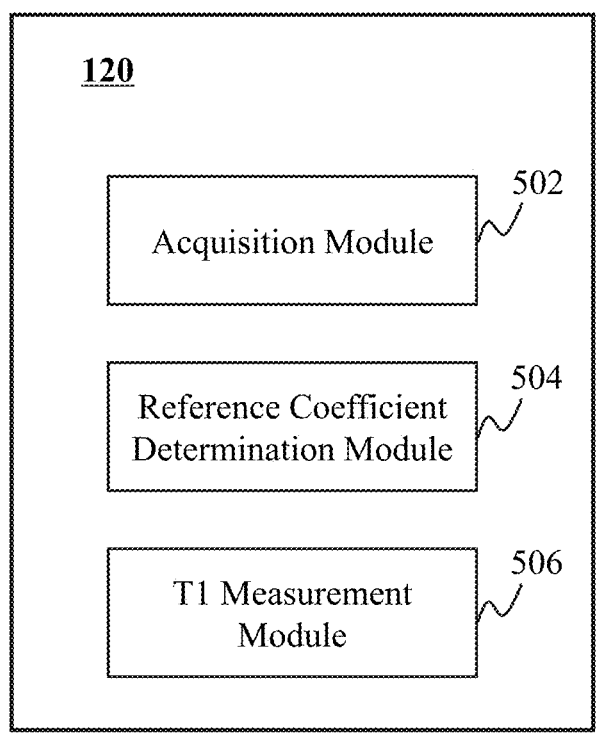
FIG. 5 is a block diagram illustrating an exemplary processing device according to some embodiments of the present disclosure.

FIG. 5 is a block diagram illustrating an exemplary processing device 120 according to some embodiments of the present disclosure. As shown in FIG. 5, the processing device 120 may include an acquisition module 502, a reference coefficient determination module 504, and a T1 measurement module 506.

The acquisition module 502 may be configured to obtain information relating to the MRI system 100. For example, the acquisition module 502 may obtain a first set of MRI data relating to a physical point (an exemplary embodiment of a subject disclosed herein) acquired by an MR scanner in a first acquisition when the physical point reaches a first T1 weighting level, and obtain a second set of MRI data relating to the physical point acquired by the MR scanner in a second acquisition when the physical point reaches a second T1 weighting level different from the first T1 weighting level. The first acquisition and the second acquisition may be performed by applying an MR pulse sequence that is defined by one or more pulse sequence parameters (e.g., a TR, an FA) on the patient. In some embodiments, the first acquisition may be applied according to one or more first values, each of which corresponds to one of the one or more pulse sequence parameters. The second acquisition may be applied according to one or more second values, each of which corresponds to one of the one or more pulse sequence parameters. The first value and the second value of at least one of the one or more pulse sequence parameters may be different. More descriptions regarding the obtaining of the first and second sets of MRI data may be found elsewhere in the present disclosure. See, e.g., operations 601 and 602 and relevant descriptions thereof.

The reference coefficient determination module 504 may be configured to determine a target value of a reference coefficient associated with a first B1 inhomogeneity in the first acquisition and a second B1 inhomogeneity in the second acquisition based on the first set of MRI data and the second set of MRI data. B1 inhomogeneity may occur during an acquisition and result in a discrepancy between an actual FA and the preset FA at the physical point during the acquisition. Due to the first B1 inhomogeneity, a first actual FA at the physical point during the first acquisition may be different from the first FA of the first acquisition. Due to the second B1 inhomogeneity, a second actual FA at the physical point during the second acquisition may be different from the second FA of the second acquisition. The present disclosure may utilize a reference coefficient that is associated with both the first B1 inhomogeneity and the second B1 inhomogeneity to perform T1 measurement, thereby achieving an improved accuracy of T1 measurement. More descriptions regarding the determination of the target value of the reference coefficient may be found elsewhere in the present disclosure. See, e.g., operation 603 and relevant descriptions thereof.

The T1 measurement module 506 may be configured to determine a T1 value of the physical point based at least in part on the target value of the reference coefficient. In some embodiments, the T1 measurement module 506 may determine a correction coefficient with respect to T1 measurement based at least in part on the target value of the reference coefficient, and determine the T1 value of the physical point based at least in part on the correction coefficient. More descriptions regarding the determination of the T1 value of the physical point may be found elsewhere in the present disclosure. See, e.g., operation 604 and relevant descriptions thereof.

In some embodiments, the modules may be hardware circuits of all or part of the processing device 120. The modules may also be implemented as an application or set of instructions read and executed by the processing device 120. Further, the modules may be any combination of the hardware circuits and the application/instructions. For example, the modules may be part of the processing device 120 when the processing device 120 is executing the application/set of instructions.

It should be noted that the above description of the processing device 120 is provided for the purposes of illustration, and is not intended to limit the scope of the present disclosure. For persons having ordinary skills in the art, multiple variations and modifications may be made under the teachings of the present disclosure. However, those variations and modifications do not depart from the scope of the present disclosure. In some embodiments, the processing device 120 may further include one or more additional modules, such as a storage module. Additionally or alternatively, one or more of the modules described above may be omitted. In addition, any module mentioned above may be implemented in two or more separate units.

FIG. 6 is a flowchart illustrating an exemplary process for determining a T1 value of a subject according to some embodiments of the present disclosure. In some embodiments, one or more operations of process 600 may be implemented in the MRI system 100 illustrated in FIG. 1. For example, the process 600 may be stored in a storage device (e.g., the storage device 130, the storage device 320, and/or the storage 490) of the MRI system 100 in the form of instructions, and invoked and/or executed by the processing device 120 (e.g., the processor 310 of the computing device 300 as illustrated in FIG. 3, the CPU 440 of the mobile device 400 as illustrated in FIG. 4, one or more modules as illustrated in FIG. 5).

As used herein, the T1 value of the subject refers to a time constant for regrowth of longitudinal magnetization (e.g., along the main magnetic field). For illustration purposes, the following descriptions take a physical point of a patient as an exemplary subject. It should be noted that the subject may be a physical point of another object, such as a portion of the patient, an animal, a made object (e.g., a phantom), etc. In addition, it should be understood that the determination of the T1 value of the physical point hereinafter is merely provided as an example, and the process 600 may be used to determine a value of one or more other quantitative parameters (e.g., a T2 value, a T2*value, an R2 value) of the subject.

As described elsewhere in this disclosure, to perform T1 measurement on a physical point, a plurality of acquisitions with different pulse sequence parameter values (e.g., different flip angles or different repetition times) may be applied to acquire a plurality of sets of MRI data when the physical point reaches different T1 weighting levels. Due to a B1 inhomogeneity occurred in each acquisition, a discrepancy may exist between an actual FA at the physical point and a preset FA during the acquisition, which may affect the set of MRI data acquired in the acquisition and the accuracy of the T1 measurement performed based on the set of MRI data. In addition, different acquisitions may have different B1 inhomogeneity. Thus, the T1 value of the physical point may need to be determined by taking the different B1 inhomogeneity in different acquisitions into consideration, so as to improve the accuracy of the determined T1 value.

In 601, the processing device 120 (e.g., the acquisition module 502) may obtain a first set of MRI data relating to the physical point acquired by an MR scanner in a first acquisition when the physical point reaches a first T1 weighting level.

In 602, the processing device 120 (e.g., the acquisition module 502) may obtain a second set of MRI data relating to the physical point acquired by the MR scanner in a second acquisition when the physical point reaches a second T1 weighting level different from the first T1 weighting level.

A set of MRI data acquired in an acquisition (e.g., the first or second acquisition) may include data (e.g., a set of echo signals) obtained by the MR scanner via scanning the patient. For example, the first set of MRI data may include a first set of echo signals acquired in the first acquisition, and the second set of MRI data may include a second set of echo signals acquired in the second acquisition. In some embodiments, the MR scanner may include a plurality of coil units, each of which may be configured to detect echo signals independently during the scan of the patient. The first set and second set of echo signals may include echo signals detected by one or more of the coil units during the first acquisition and the second acquisition, respectively.

The first acquisition and the second acquisition may be performed on the patient by applying an MR pulse sequence on the patient. The first acquisition and the second acquisition may be performed in any sequence during the scan of the patient. The MR pulse sequence may be defined by one or more pulse sequence parameters, e.g., the type of the MR pulse sequence, a count (or number) of acquisitions, the TR of an acquisition, the FA of an excitation pulse in the MR pulse sequence, an inversion time, or the like, or any combination thereof. Exemplary MR pulse sequences for implementing the first and second acquisitions may include a variable FA (VFA) pulse sequence (e.g., a GRE pulse sequence having different FAs in different acquisitions), a variable TR (VTR) pulse sequence (e.g., a GRE pulse sequence having different TRs in different acquisitions), or the like.

In some embodiments, the first acquisition may be applied according to one or more first values, each of which corresponds to one of the one or more pulse sequence parameters. The second acquisition may be applied according to one or more second values, each of which corresponds to one of the one or more pulse sequence parameters. The first value and the second value of at least one of the one or more pulse sequence parameters may be different. In some embodiments, the set of MRI data acquired in an acquisition may be affected by the value(s) of the pulse sequence parameter(s) (e.g., the TR, the FA) corresponding to the acquisition, the T1 value of the physical point, and/or one or more other quantitative parameters of the physical point. Using different values of the at least one pulse sequence parameter in the first and second acquisitions may achieve different T1 weighting levels in the first and second acquisitions. A T1 weighting level in an acquisition may reflect the influence of the T1 value with respect to the set of MRI data acquired in the acquisition. For example, a T1 weighting level in an acquisition may reflect the influence of the T1 value with respect to the intensity of MRI signals acquired in the acquisition.

For illustration purposes, the following descriptions take a GRE pulse sequence as an exemplary, but not intended to be limiting. During an acquisition implemented by a GRE pulse sequence, the signal intensity at the physical point during an acquisition may be represented according Equation (1) (or referred to as a Block equation) as below:

$$S \propto \frac{(1-E_1)\sin(\alpha)}{1-E_1\cos(\alpha)}, \tag{1}$$

where S refers to a signal intensity at the physical point during the acquisition and α refers to a preset FA of an excitation pulse in the acquisition. $E_1$ may be equal to $e^{-TR/T1}$, wherein TR refers to a timespan between two repeating and consecutive RF pulses in the acquisition, and T1 refers to a T1 value of the physical point. In some embodiments, because TR is far less than the T1 value, $E_1$ may be approximated by $$\left(1 - \frac{TR}{T1}\right).$$

According to Equation (1), the signal intensity at the physical point may be associated with the FA and the TR of the GRE pulse sequence in the acquisition as well as the T1 value of the physical point. By using different FAs and/or TRs in the first and second acquisitions, the T1 weighting level of the physical point in the first acquisition (i.e., the first T1 weighting level) may be different from the T1 weighting level of the physical point in the second acquisition (i.e., the second T1 weighting level). Merely by way of example, the first acquisition may be applied according to a first FA (denoted as $\alpha_1$), the second acquisition may be applied according to a second FA (denoted as $\alpha_2$) different from the first FA $\alpha_1$, and the first value and the second value of a pulse sequence parameter (e.g., the TR) other than the FA is the same. More descriptions regarding the obtaining of the first and second sets of MRI data may be found elsewhere in the present disclosure. See, e.g., Examples 1 and 2.

In 603, the processing device 120 (e.g., the reference coefficient determination module 504) may determine a target value of a reference coefficient associated with a first B1 inhomogeneity in the first acquisition and a second B1 inhomogeneity in the second acquisition based on the first set of MRI data and the second set of MRI data.

As described elsewhere in the present disclosure, B1 inhomogeneity may occur during an acquisition and result in a discrepancy between an actual FA and the preset FA at the physical point during the acquisition. For example, an actual FA at the physical point during an acquisition may be approximately equal to $\gamma B_1 t$ when the preset FA of the acquisition is relatively small (e.g., smaller than a threshold angle), wherein t refers to a time period for applying an excitation pulse during the acquisition, $B_1$ refers to the an actual B1 field during the acquisition, and γ refers to a gyromagnetic ratio. Due to the first B1 inhomogeneity, a first actual FA (denoted as $\alpha'_1$) at the physical point during the first acquisition may deviate from the first FA of the first acquisition $\alpha_1$. For example, $\alpha'_1$ may be equal to $r1*\alpha_1$, wherein r1 may reflect an impact factor of the first B1 inhomogeneity. Similarly, due to the second B1 inhomogeneity, a second actual FA (denoted as $\alpha'_2$) at the physical point during the second acquisition may deviate from the second FA of the second acquisition $\alpha_2$. For example, $\alpha'_2$ may be equal to $r2*\alpha_2$, wherein r2 may reflect an impact factor of the second B1 inhomogeneity.

Conventional T1 measurement approaches may assume that the first B1 inhomogeneity is consistent with the second B1 inhomogeneity, and determine the first actual FA α'1 (or r1) and/or the second actual FA α'$_2$ (or r2). However, because that the first B1 inhomogeneity may be different from the second B1 inhomogeneity (i.e., r1 may be different from r2), the conventional T1 measurement approaches may have a reduced precision. The present disclosure may utilize a reference coefficient that is associated with both the first B1 inhomogeneity and the second B1 inhomogeneity to perform T1 measurement, thereby achieving an improved accuracy of T1 measurement.

In some embodiments, the reference coefficient may measure a difference between a first signal intensity at the physical point during the first acquisition and a second signal intensity at the physical point during the second acquisition. Merely by way of example, the reference coefficient may be a ratio of the second signal intensity to the first signal intensity, which may be represented according to Equation (2) as below:

$$R' = \frac{S(\alpha'_2)}{S(\alpha'_1)} = \frac{1 - E_1\cos(\alpha'_1)}{1 - E_1\cos(\alpha'_2)} \cdot \frac{\sin(\alpha'_2)}{\sin(\alpha'_1)} = \frac{1 - E_1\cos(r_1\alpha_1)}{1 - E_1\cos(r_2\alpha_2)} \cdot \frac{\sin(r_2\alpha_2)}{\sin(r_1\alpha_1)}, \quad (2)$$

where S(α'$_1$) refers to the first signal intensity at the physical point during the first acquisition, S(α'$_2$) refers to the second signal intensity at the physical point during the second acquisition, and R' refers to the target value of the reference coefficient.

As shown in Equation (2), the reference coefficient may be associated with both α'$_1$ (i.e., r1*α$_1$) and α'$_2$ i.e., r2*α$_2$). In other words, the reference coefficient may be associated with both the first B1 inhomogeneity (e.g., represented by r1) in the first acquisition and the second B1 inhomogeneity (e.g., represented by r2) in the second acquisition. It should be understood that Equation (2) is merely provided for illustration purposes, the reference coefficient may be represented in any other form. For example, the reference coefficient may be determined by subtracting the first signal intensity from the second signal intensity. As another example, the reference coefficient may be a ratio of the first signal intensity to the second signal intensity.

The target value of the reference coefficient refers to an actual value of the reference coefficient that is determined based on the first and second sets of MRI data. For example, the first set of MRI data and the second set of MRI data may be acquired in an MRI scan of the patient. The processing device 120 may reconstruct a first image of the patient based on the first set of MRI data using an MR image reconstruction algorithm such as a Fourier transform (FFT) algorithm. The processing device 120 may also reconstruct a second image of the patient based on the second set of MRI data using the image reconstruction algorithm. The processing device 120 may further determine the target value of the reference coefficient based on the first image and the second image.

For example, a pixel value or a voxel value corresponding to the physical point in the first image may represent the first signal intensity at the physical point during the first acquisition, and a pixel value or a voxel value corresponding to the physical point in the second image may represent the second signal intensity at the physical point during the second acquisition. The processing device 120 may generate a difference image between the first image and the second image by, for example, dividing the second image by the first image. The processing device 120 may identify an element (e.g., a pixel or voxel) corresponding to the physical point from the difference image, and designate the value of the element as the target value of the reference coefficient. As another example, the processing device 120 may identify a first element (e.g., a pixel or voxel) corresponding to the physical point in the first image and identify a second element (e.g., a pixel or voxel) corresponding to the physical point in the second image. The processing device 120 may determine the target value of the reference coefficient based the value of the first element and the value of the second element. Merely by way of example, a ratio of the value of the second element to the value of the first element may be determined as the target value of the reference coefficient.

In 604, the processing device 120 (e.g., the T1 measurement module 506) may determine the T1 value of the physical point based at least in part on the target value of the reference coefficient.

In some embodiments, the processing device 120 may determine a correction coefficient with respect to T1 measurement based at least in part on the target value of the reference coefficient, and determine the T1 value of the physical point based at least in part on the correction coefficient. The determination of the T1 value of the physical point may involve B1 field correction performed based on the correction coefficient, so that the determined T1 value may be regarded as a corrected T1 value of the physical point. More descriptions regarding the determination of the T1 value of the physical point may be found elsewhere in the present disclosure. See, e.g., FIG. 7 and relevant descriptions thereof. In some embodiments, operation 604 may be omitted. In some embodiments, the target value of the reference coefficient may be used to perform other quantitative measurement on the physical point.

It should be noted that the above description regarding the process 600 is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. In some embodiments, the process 600 may be accomplished with one or more additional operations not described and/or without one or more of the operations discussed above. For example, the process 600 may include an additional operation to transmit the T1 value of the physical point to a terminal device (e.g., a terminal device 140 of a doctor) for display.

In some embodiments, three or more acquisitions may be performed on the patient. The processing device 120 may obtain more than two sets of MRI data relating to the physical point. Each set of the more than two sets of MRI data may be obtained in one of the acquisitions when the physical point reaches a distinctive T1 weighting level. For example, the acquisitions may be applied with different FAs. In some embodiments, the three or more acquisitions may form a plurality of pairs of acquisitions. For example, the acquisition with the smallest FA may be paired with each of the remaining acquisitions. As another example, the three or more acquisitions may be randomly paired. For each pair of acquisitions, the processing device 120 may determine an initial T1 value of the physical point based on the two sets of MRI data corresponding to the pair of acquisitions. For example, for each pair of acquisitions, one acquisition of the pair may be regarded as the first acquisition, the other acquisition may be regarded as the second acquisition, and the processing device 120 may perform the process 600 for the pair of acquisitions to determine the initial T1 value. The processing device 120 may further determine the T1 value of the physical point by combining the initial T1 values corresponding to the pairs of acquisitions. For example, an average value of the initial T1 values may be determined as the T1 value of the physical point.

In some embodiments, the patient may include a plurality of physical points. For each physical point of the patient, the processing device 120 may determine the T1 value of the physical point by performing the process 600. Optionally, a T1 map that includes the T1 value of each physical point may be generated for medical diagnoses.

FIG. 7 is a flowchart illustrating an exemplary process for determining a T1 value of a physical point based at least in part on a target value of a reference coefficient according to some embodiments of the present disclosure. In some embodiments, one or more operations of process 700 may be implemented in the MRI system 100 illustrated in FIG. 1. For example, the process 700 may be stored in a storage device (e.g., the storage device 130, the storage device 320, and/or the storage 490) of the MRI system 100 in the form of instructions, and invoked and/or executed by the processing device 120 (e.g., the processor 310 of the computing device 300 as illustrated in FIG. 3, the CPU 440 of the mobile device 400 as illustrated in FIG. 4, one or more modules as illustrated in FIG. 5). In some embodiments, one or more operations of the process 700 may be performed to achieve at least part of operation 604 as described in connection with FIG. 6.

As described in connection with FIG. 6, a first acquisition and a second acquisition may be performed on the patient to acquire a first set of MRI data and a second set of MRI data of the patient. The first acquisition and the second acquisition may correspond to different values of at least one pulse sequence parameter (e.g., the FA). Based on the first set of MRI data and the second set of MRI data, a target value of a reference coefficient associated with the first B1 inhomogeneity in the first acquisition and the second B1 inhomogeneity in the second acquisition may be determined. For illustration purposes, it is assumed that the first and second sets of MRI data are acquired by applying a GRE pulse sequence. The GRE pulse sequence may include a first acquisition performed according to a first flip angle $\alpha_1$ and a second acquisition performed according to a second flip angle $\alpha_2$. The first and second acquisitions may have a same TR. The ratio of a second signal intensity at the physical point during the second acquisition to a first intensity at the physical point during the first acquisition is taken as an exemplary reference coefficient hereinafter. It should be noted that the following descriptions are merely provided for illustration purposes, and not intend to limit the disclosure. The reference coefficient may be any other suitable parameter. The first and second sets of MRI data may be acquired by applying any other MR pulse sequence.

In 701, the processing device 120 (e.g., the T1 measurement module 506) may determine a reference value of the reference coefficient based on the one or more first values and the one or more second values of the one or more pulse sequence parameters.

The reference value of the reference coefficient refers to an estimated value (or ideal value) of the reference coefficient when the first B1 inhomogeneity and the second B1 inhomogeneity are not taken into consideration. For example, if the first B1 inhomogeneity and the second B1 inhomogeneity are not taken into consideration, the first actual FA $\alpha'_1$ in the first acquisition may be equal to the first FA $\alpha_1$, and the second actual FA $\alpha'_2$ in the second acquisition may be equal to the second FA $\alpha_2$. According to $\alpha_1$, $\alpha_2$, and value(s) of other pulse sequence parameter(s), a ratio of a second estimated (or ideal) signal intensity at the physical point in the second acquisition to a first estimated (or ideal) signal intensity at the physical point in the first acquisition may be determined as the reference value of the reference coefficient. Merely by way of example, the reference value of the reference coefficient may be represented as $$\frac{S(\alpha_2)}{S(\alpha_1)},$$

wherein $S(\alpha_1)$ may represent a first estimated (or ideal) signal intensity at the physical point in the first acquisition when $\alpha'_1$ is equal to $\alpha_1$, and $S(\alpha_2)$ may represent a second estimated (or ideal) signal intensity at the physical point in the second acquisition when $\alpha'_2$ is equal to $\alpha_2$.

In some embodiments, the processing device 120 may determine a reference T1 value of the physical point, and determine the reference value of the reference coefficient based on the reference T1 value and Equation (1) as described in connection with FIG. 6. For example, the reference T1 value of the physical point may be determined according to an organ or a tissue where the physical point is located, a material type of the physical point (e.g., water, fat, muscle), or the like, or any combination thereof. Merely by way of example, if the physical point is located in the brain of a patient, the reference T1 value may be an average T1 value of human brain. $S(\alpha_1)$ may be determined by inputting the reference T1 value, $\alpha_1$, and TR into Equation (1). $S(\alpha_2)$ may be determined by inputting the reference T1 value, $\alpha_2$, and TR into Equation (1). Then, the processing device 120 may determine the reference value of the reference coefficient (i.e., R) by dividing $S(\alpha_2)$ by $S(\alpha_1)$.

In 702, the processing device 120 (e.g., the T1 measurement module 506) may determine a correction coefficient with respect to T1 measurement based on the reference value and the target value of the reference coefficient.

In some embodiments, the correction coefficient may measure a degree of similarity between the target value of the reference coefficient (i.e., R') and the reference value of the reference coefficient (i.e., R). For example, the correction coefficient may be a ratio of R to R' or a ratio of R' to R. Similar to the reference coefficient, the correction coefficient (e.g., R/R' or R'/R) may also take both the first B1 inhomogeneity and the second B1 inhomogeneity into consideration.

According to Equation (1) as described in connection with FIG. 6, the signal intensity at the physical point during an acquisition may be affected by the actual FA at the physical point (which reflects the B1 inhomogeneity during the acquisition) and the T1 value of the physical point. In such cases, the correction coefficient may be associated with the first B1 inhomogeneity, the second B1 inhomogeneity, as well as the T1 value of the physical point. According to an experiment result as described in connection with FIG. 8, the T1 value has a relatively smaller effect on the correction coefficient compared to the first and second B1 inhomogeneity. When the T1 value exceeds a threshold value, the T1 value may have a very small impact on the correction coefficient, and the impact of the T1 value may be ignored. In other words, the correction coefficient may be mainly determined by the first B1 inhomogeneity and the second B1 inhomogeneity. Therefore, the correction coefficient may be used to eliminate or reduce the effect of the first B1 inhomogeneity and the second B1 inhomogeneity in T1 measurement.

In 703, the processing device 120 (e.g., the T1 measurement module 506) may determine the T1 value of the physical point (denoted as T"$_1$) based at least in part on the correction coefficient.

In some embodiments, the processing device 120 may determine a preliminary T1 value (denoted as T'$_1$) of the physical point based on the first flip angle $\alpha_1$ (or the first set of MRI data acquired with the first flip angle $\alpha_1$), the second flip angle $\alpha_2$ (or the second set of MRI data acquired with the second flip angle $\alpha_2$), and the reference value R of the reference coefficient. For example, the preliminary T1 value of the physical point may be determined by inputting R, TR, $\alpha_1$, and $\alpha_2$ into Equation (3) as below:

$$T'_1 = TR \cdot \frac{R \cdot \sin(\alpha_1)\cos(\alpha_2) - \sin(\alpha_2)\cos(\alpha_1)}{\sin(\alpha_2)*(1-\cos(\alpha_1)) - R \cdot \sin(\alpha_1)(1-\cos(\alpha_2))}. \quad (3)$$

The processing device 120 may further determine the T1 value of the physical point by correcting the preliminary T1 value according to the correction coefficient. For example, the T1 value of the physical point may be equal to T'$_1$*r, wherein r may represent the correction coefficient.

In some embodiments, the processing device 120 may correct one of the first flip angle $\alpha_1$ and the second flip angle $\alpha_2$ according to the correction coefficient. For example, if the reference coefficient is equal to $$\frac{S(\alpha'_1)}{S(\alpha'_2)},$$

the first nip angle $\alpha_1$ may be corrected to determine a corrected first flip angle $\alpha''_1$. The corrected first flip angle $\alpha''_1$ may be equal to $\alpha_1$*r. The processing device 120 may then determine the T1 value of the physical point based on the corrected first flip angle $\alpha''_1$, the second flip angle $\alpha_2$, and the target value R' of the reference coefficient. For example, the T1 value of the physical point may be determined by inputting $\alpha''_1$, $\alpha_2$, and R' into Equation (3), that is, according to Equation (4) as below:

$$T''_1 = TR \cdot \frac{R'\sin(\alpha''_1)\cos(\alpha_2) - \sin(\alpha_2)\cos(\alpha''_1)}{\sin(\alpha_2)*(1-\cos(\alpha''_1)) - R' \cdot \sin(\alpha''_1)(1-\cos(\alpha_2))}. \quad (4)$$

If the reference coefficient is equal to $$\frac{S(\alpha'_2)}{S(\alpha'_1)},$$

the second flip angle $\alpha_2$ may be corrected to determine a corrected second flip angle $\alpha''_2$. The corrected second flip angle $\alpha''_2$ may be equal to $\alpha_2$*r. The processing device 120 may then determine the T1 value of the physical point based on the first flip angle $\alpha_1$, the corrected second flip angle $\alpha''_2$, and the target value R' of the reference coefficient. For example, the T1 value of the physical point may be determined by inputting $\alpha_1$, $\alpha''_2$, and R' into Equation (3), that is, according to Equation (5) as below:

$$T''_1 = TR \cdot \frac{R'\sin(\alpha_1)\cos(\alpha''_2) - \sin(\alpha''_2)\cos(\alpha_1)}{\sin(\alpha''_2)*(1-\cos(\alpha_1)) - R' \cdot \sin(\alpha_1)(1-\cos(\alpha''_2))}. \quad (5)$$

According to some embodiments of the present disclosure, a target value and a reference value of a reference coefficient may be determined. The reference coefficient may be associated with both the first B1 inhomogeneity in the first acquisition and the second B1 inhomogeneity in the second acquisition. Based on the target value and the reference value of the reference coefficient, a correction coefficient, instead of the first B1 inhomogeneity or the second B1 inhomogeneity, may be determined. The correction coefficient may be used to eliminate or reduce the effect of the first and second B1 inhomogeneity in the determination of the T1 value of the physical point, thereby improving the accuracy of the determined T1 value.

It should be noted that the above description regarding the process 700 is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. In some embodiments, the process 700 may be accomplished with one or more additional operations not described and/or without one or more of the operations discussed above. In addition, the equations provided above may be modified according to an actual need. For example, one or more coefficients of an equation may be omitted, and/or the equation may include one or more additional coefficients. As another example, an analytic solution for T1 measurement implemented according to the Equations (1) to (3) as described above may be replaced by one or more other algorithms (e.g., a driven equilibrium single pulse observation (DESPOT) algorithm) for T1 measurement. As yet another example, if the first and second acquisitions are performed according to a pulse sequence other than a GRE pulse sequence, the signal intensity at the physical point during an acquisition may be represented in another equation different from Equation (1).

EXAMPLES

The examples are provided for illustration purposes, and not intended to limit the scope of the present disclosure.

Example 1

A simulated experiment was performed to evaluate the accuracy of systems and methods for T1 measurement as described in connection with FIGS. 6 and 7. A physical point of the brain of a patient is taken as an exemplary subject in the simulated experiment. The reference T1 value (denoted as T1$_{ref}$) of the physical point is set between 300 and 3500 milliseconds (ms), which is a typical range of brain tissue in a typical 3T MRI scan. It is assumed that an MRI scan is performed on the brain of the patient by applying a GRE pulse sequence that includes a first acquisition with a first FA and a second acquisition with a second FA. The first FA and the second FA are set to be equal to 4° and 32°, respectively. The TRs of the first acquisition and the second acquisition are both equal to 10 ms.

For a specific reference T1 value of the physical point, an ideal T1 value (denoted as T$_1$), a preliminary uncorrected T1 value (denoted as $t'_1$), and a corrected T1 value (denoted as $T''_1$) of the physical point were determined according to the following descriptions.

A reference value R of the reference coefficient was determined based on the TR (i.e., 10 ms), the first FA (i.e., 4°), the second FA (i.e., 32°), and the specific reference value. Specifically, the reference value R was equal to a ratio of $S(\alpha_2)$ to $S(\alpha_1)$, wherein $S(\alpha_1)$ represents a first estimated signal intensity at the physical point during the first acquisition, and $S(\alpha_2)$ represents a second estimated signal intensity at the physical point during the second acquisition. The reference value R was determined according to methods as described in connection with operation 701. Then, an ideal T1 value corresponding to the specific reference T1 value was determined by inputting the reference value R, the first FA (i.e., 4°), and the second FA (i.e., 32°) into Equation (3) as described in connection with 703. The determination of the ideal T1 value was performed without considering the first B1 inhomogeneity in the first acquisition and the second B1 inhomogeneity in the second acquisition.

A plurality of simulated scans were performed according to a Monte-Carlo Simulation algorithm. In each simulated scan, a random noise was added, a first random impact factor with respect to the first B1 inhomogeneity was multiplied with the first actual FA to generate a first actual FA of the first acquisition, and a second random impact factor with respect to the second B1 inhomogeneity was multiplied with the second FA to generate a second actual FA of the second acquisition. The first random impact factor and the second random impact factor were both in a range of 0.8 to 1.2. For each simulated scan, the target value R' of the reference coefficient was determined as $$\frac{S(\alpha'_2)}{S(\alpha'_1)},$$

wherein $S(\alpha'_1)$ represents an actual first signal intensity at the physical point during the first acquisition and $S(\alpha'_2)$ represents an actual second signal intensity at the physical point during the second acquisition. $S(\alpha'_1)$ and $S(\alpha'_2)$ were determined according to simulated MRI data acquired in the simulated scan. Then, a preliminary uncorrected T1 value of the physical point corresponding to the specific reference T1 value was determined by inputting R', the first FA (i.e., 4°), and the second FA (i.e., 32°) into Equation (3) as described in connection with 703. The determination of the preliminary uncorrected T1 value takes the first and second B1 inhomogeneity into consideration (i.e., by using the target value of the reference coefficient) but was performed without B1 field correction.

Further, for each simulated scan, a ratio of R to R' was determined as a correction coefficient (denoted as r). A corrected second FA was determined by multiplying the correction coefficient with the second FA. A corrected T1 value of the physical point corresponding to the specific reference T1 value was determined by inputting R', the first FA (i.e., 4°), and the corrected second FA into the Equation (3) as described in connection with 703. The determination of the corrected T1 value takes the first and second B1 inhomogeneity into consideration (i.e., by using the target value of the reference coefficient) and involves B1 field correction.

Figure 8:
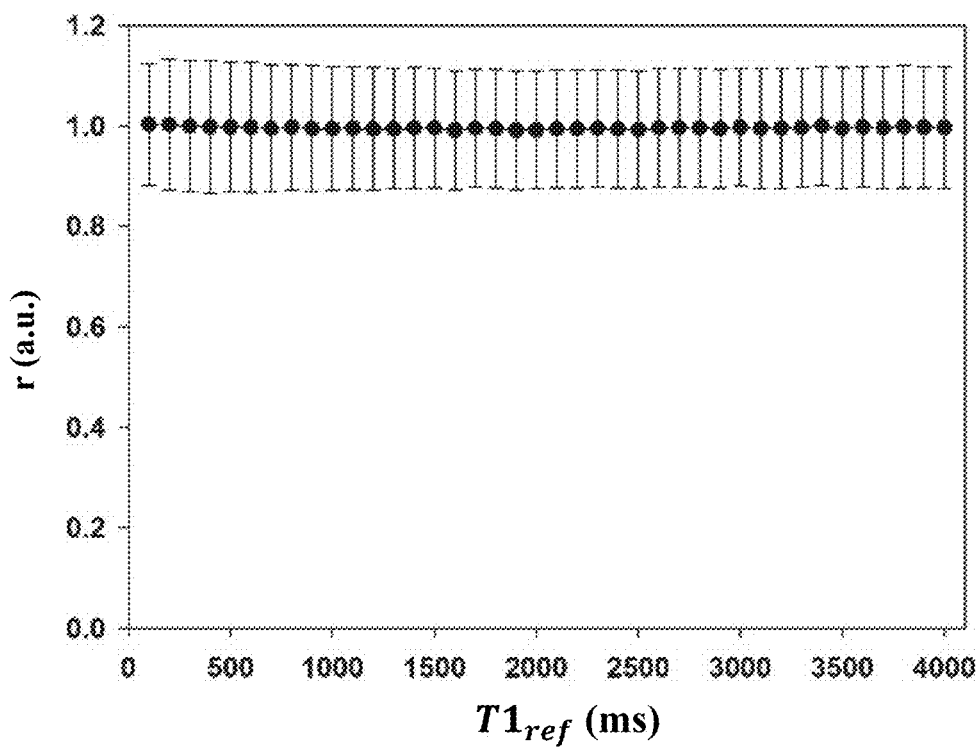
FIG. 8 is a schematic diagram illustrating a result of a simulated experiment according to some embodiments of the present disclosure.

FIG. 8 is a schematic diagram illustrating a relationship between the correction coefficient and the reference T1 value corresponding to a physical point determined based on the result of the simulated experiment. In FIG. 8, the horizontal coordinate of a point represents a specific reference T1 value, the vertical coordinate of the point represents an average value of the correction coefficients determined based on the plurality of simulated scans corresponding to the specific reference T1 value, and the dotted line passing through the point represents a variance value of the correction coefficients. As shown in FIG. 8, the correction coefficients corresponding to different reference T1 values are approximately the same, suggesting that the T1 value of a physical point has little impact on a correction coefficient of the physical point.

Figure 9A:
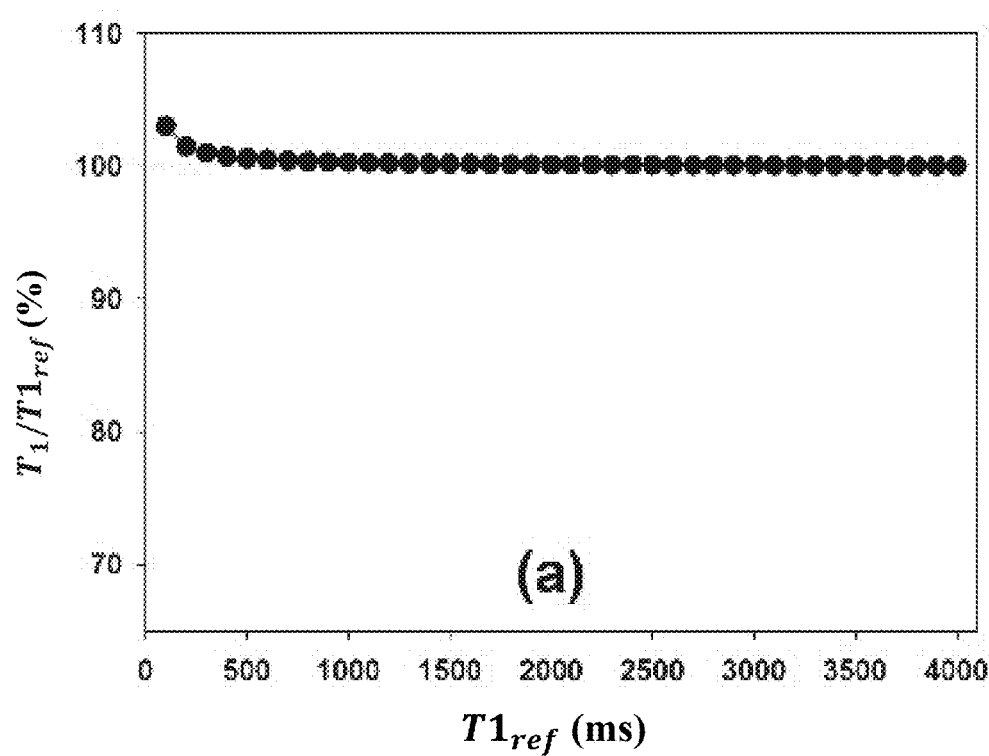
FIGS. 9A to 9C are schematic diagrams illustrating a result of a simulated experiment according to some embodiments of the present disclosure.

FIG. 9A is a schematic diagram illustrating a relationship between the ideal T1 value and the reference T1 value determined based on the result of the simulated experiment. In FIG. 9A, the horizontal coordinate of a point represents a specific reference T1 value, the vertical coordinate of the point represents an average value of a first ratio of the ideal T1 value to the specific reference T1 value determined based on the plurality of simulated scans corresponding to the specific reference T1 value, and the dotted line passing through the point represents a variance value of the first ratio. As shown in FIG. 9A, when the reference T1 value is small (e.g., smaller than 200 ms), the ideal T1 value is greater than the reference T1 value, which suggests that an error was caused by the mathematical operations performed in T1 measurement (e.g., by Equations (1) and (3)). When the reference T1 value is greater than 200 ms, the ideal T1 value is close to the reference T1 value and the error caused by the mathematical operations can be neglected.

Figure 9B:
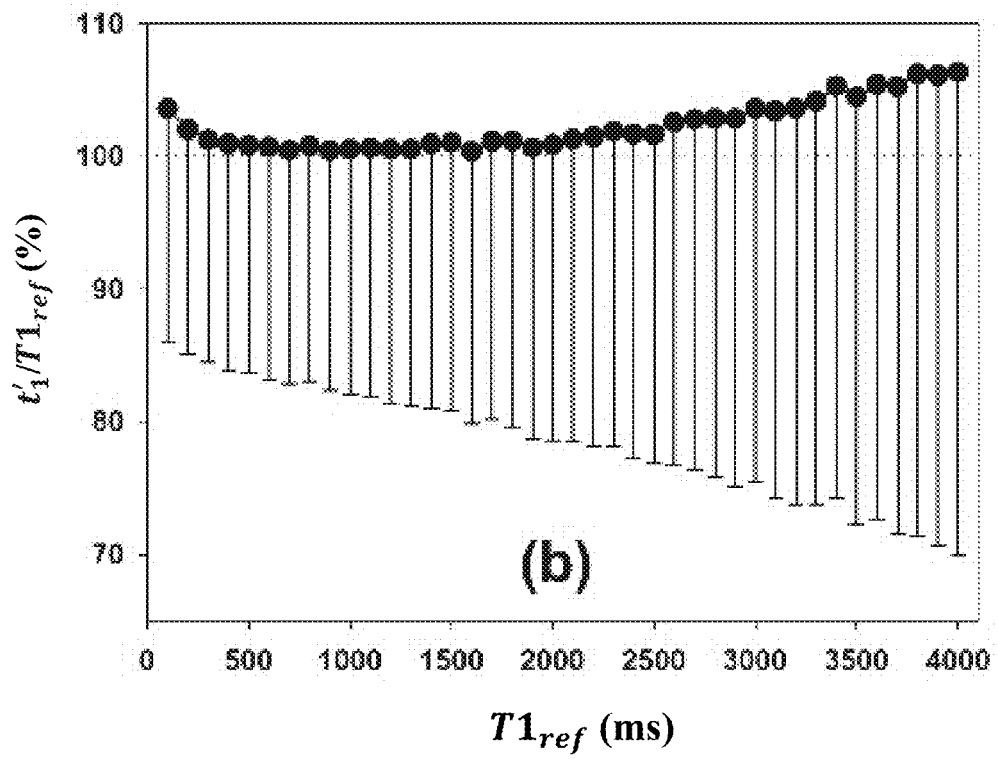

FIG. 9B is a schematic diagram illustrating a relationship between the preliminary uncorrected T1 value and the reference T1 value determined based on the result of the simulated experiment. In FIG. 9B, the horizontal coordinate of a point represents a specific reference T1 value, the vertical coordinate of the point represents an average value of a second ratio of the preliminary uncorrected T1 value to the reference T1 value determined based on the plurality of simulated scans corresponding to the specific reference T1 value, and the dot line passing through the point represents a variance value of the second ratio. As shown in FIG. 9B, the preliminary uncorrected T1 value deviates from the reference T1 value and has a great variance, especially when the reference T1 value is smaller than 200 ms or greater than 2000 ms.

Figure 9C:
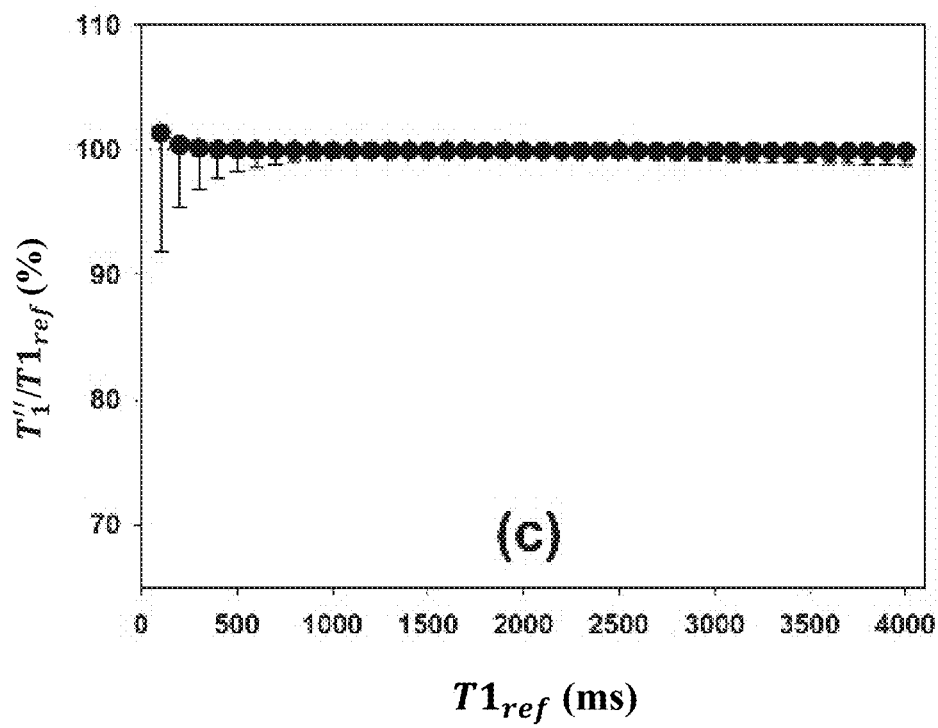

FIG. 9C is a schematic diagram illustrating a relationship between the corrected T1 value and the reference T1 value determined based on the result of the simulated experiment. In FIG. 9C, the horizontal coordinate of a point represents a specific reference T1 value, the vertical coordinate of the point represents an average value of a third ratio of the corrected T1 value to the specific reference T1 value determined based on the plurality of simulated scans corresponding to the specific reference T1 value, and the dotted line passing through the point represents a variance value of the third ratio. As shown in FIG. 9C, when reference T1 value is greater than 200 ms, the corrected T1 value is basically equal to the reference T1 value and has a relatively smaller variance.

According to FIGS. 9A, 9B, and 9C, the systems and methods disclosed herein may improve the accuracy of T1 measurement.

Example 2

An MRI scan was performed on an ISMRM water phantom according to a 3D GRE pulse sequence. During the scan of the ISMRM water phantom, a first acquisition with a first FA of 4° and a second acquisition with a second FA of 16° were performed. Each physical point of the ISMRM water phantom has a known reference T1 value. For each physical point of the ISMRM water phantom, a preliminary T1 value was determined based on the first FA and the second FA. In addition, for each physical point of the ISMRM water phantom, a value of a correction coefficient and a corrected T1 value of the physical point was determined by performing T1 measurement methods disclosed herein (e.g., FIGS. 6 and 7).

Figure 10A:
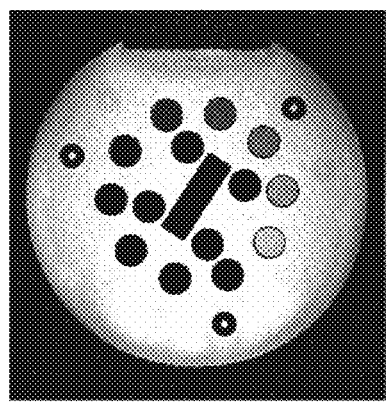
FIGS. 10A to 10D are schematic diagrams illustrating a result of an MRI scan performed on a water phantom according to some embodiments of the present disclosure.
Figure 10B:
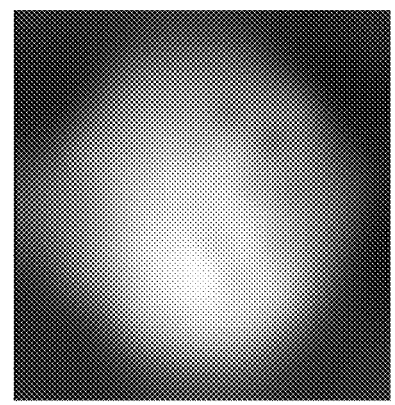
Figure 10C:
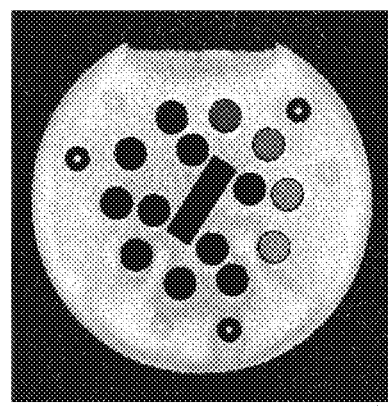

FIG. 10A illustrates a preliminary T1 map showing the preliminary T1 value of each physical point of the ISMRM water phantom. FIG. 10B illustrates a correction coefficient map showing the correction coefficient of each physical point of the ISMRM water phantom. FIG. 10O illustrates a corrected T1 map showing the corrected T1 value of each physical point of the ISMRM water phantom. Compared to the preliminary T1 map, the corrected T1 map generated by systems and methods disclosed herein has a higher quality (e.g., is more even).

Figure 10D:
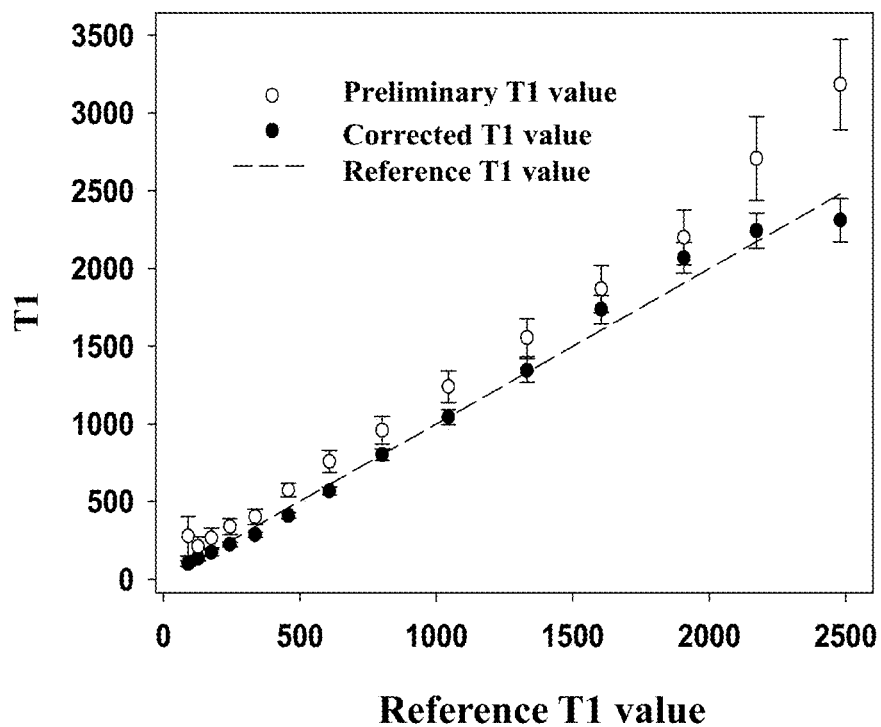

FIG. 10D is a diagram illustrating the T1 measurement result generated based on the MRI scan of the ISMRM water phantom. The horizontal axis represents the reference T1 value, and the vertical axis represents an estimated T1. The vertical coordinate of a hollow dot represents a preliminary T1 value corresponding to a specific reference T1 value. The vertical coordinate of a solid dot represents a corrected T1 value corresponding to a specific reference T1 value. The vertical coordinate of each point in a dashed line is equal to the horizontal coordinate of the point, i.e., the slope of the dashed line is equal to 1. As shown in FIG. 10D, for a specific reference T1 value, the corresponding corrected T1 value is closer to specific reference T1 value than the corresponding preliminary T1 value. This suggests that the systems and methods of the present disclosure may be used to determine a T1 value of a physical point with an improved accuracy and reliability.

For persons having ordinary skills in the art, multiple variations and modifications may be made under the teachings of the present disclosure. However, those variations and modifications do not depart from the scope of the present disclosure.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "module," "unit," "component," "device," or "system." Furthermore, aspects of the present disclosure may take the form of a computer program product embodied in one or more computer readable media having computer readable program code embodied thereon.

A computer readable signal medium may include a propagated data signal with computer readable program code embodied therein, for example, in baseband or as part of a carrier wave. Such a propagated signal may take any of a variety of forms, including electro-magnetic, optical, or the like, or any suitable combination thereof. A computer readable signal medium may be any computer readable medium that is not a computer readable storage medium and that may communicate, propagate, or transport a program for use by or in connection with an instruction execution system, apparatus, or device. Program code embodied on a computer readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C #, VB. NET, Python or the like, conventional procedural programming languages, such as the "C" programming language, Visual Basic, Fortran 2003, Perl, COBOL 2002, PHP, ABAP, dynamic programming languages such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various embodiments. This method of disclosure, however, is not to be interpreted as reflecting an intention that the claimed subject matter requires more features than are expressly recited in each claim. Rather, claim subject matter lie in less than all features of a single foregoing disclosed embodiment.

In some embodiments, the numbers expressing quantities or properties used to describe and claim certain embodiments of the application are to be understood as being modified in some instances by the term "about," "approximate," or "substantially." For example, "about," "approximate," or "substantially" may indicate a certain variation (e.g., ±1%, ±5%, ±10%, or ±20%) of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable. In some embodiments, a classification condition used in classification is provided for illustration purposes and modified according to different situations. For example, a classification condition that "a probability value is greater than the threshold value" may further include or exclude a condition that "the probability value is equal to the threshold value".

What is claimed is:

1. A system for magnetic resonance imaging (MRI), comprising:
   at least one storage device including a set of instructions; and
   at least one processor configured to communicate with the at least one storage device, wherein when executing the set of instructions, the at least one processor is configured to direct the system to perform operations including:
   obtaining a first set of MRI data relating to a subject acquired by an MR scanner in a first acquisition when the subject reaches a first T1 weighting level, the first acquisition being applied according to one or more first values each of which corresponds to one of one or more pulse sequence parameters, wherein the one or more first values of the one or more pulse sequence parameters include a first flip angle;
   obtaining a second set of MRI data relating to the subject acquired by the MR scanner in a second acquisition when the subject reaches a second T1 weighting level different from the first T1 weighting level, the second acquisition being applied according to one or more second values each of which corresponds to one of the one or more pulse sequence parameters, the first value and the second value of at least one of the one or more pulse sequence parameters being different, wherein the one or more second values of the one or more pulse sequence parameters include a second flip angle different from the first flip angle; and
   determining, based on the first set of MRI data and the second set of MRI data, a target value of a reference coefficient associated with a first B1 inhomogeneity in the first acquisition and a second B1 inhomogeneity in the second acquisition.

2. The system of claim 1, wherein the subject is a physical point of an object, and the reference coefficient measures a difference between a first signal intensity at the physical point during the first acquisition and a second signal intensity at the physical point during the second acquisition.

3. The system of claim 2, wherein the reference coefficient is a ratio of the first signal intensity to the second signal intensity or a ratio of the second signal intensity to the first signal intensity.

4. The system of claim 2, wherein the first set of MRI data and the second set of MRI data are acquired in an MRI scan of the object, and
   the determining, based on the first set of MRI data and the second set of MRI data, a target value of a reference coefficient associated with a first B1 inhomogeneity in the first acquisition and a second B1 inhomogeneity in the second acquisition comprises:
   reconstructing a first image of the object based on the first set of MRI data;
   reconstructing a second image of the object based on the second set of MRI data; and
   determining, based on the first image and the second image, the target value of the reference coefficient.

5. The system of claim 4, wherein the determining, based on the first image and the second image, the target value of the reference coefficient comprises:
   identifying, in the first image, a first element corresponding to the physical point;
   identifying, in the second image, a second element corresponding to the physical point; and
   determining, based on a value of the first element to a value of the second element, the target value of the reference coefficient.

6. The system of claim 1, wherein the operations further includes:
   determining, based at least in part on the target value of the reference coefficient, a T1 value of the subject.

7. The system of claim 6, wherein the determining, based at least in part on the target value of the reference coefficient, a T1 value of the subject comprises:
   determining, based on the one or more first values and the one or more second values of the one or more pulse sequence parameters, a reference value of the reference coefficient;
   determining, based on the reference value and the target value of the reference coefficient, a correction coefficient with respect to T1 measurement; and
   determining, based at least in part on the correction coefficient, the T1 value of the subject.

8. The system of claim 7, wherein the determining, based at least in part on the correction coefficient, the T1 value of the subject comprises:
   determining a preliminary T1 value of the subject based on the first flip angle, the second flip angle, and the reference value of the reference coefficient; and
   determining the T1 value of the subject by correcting the preliminary T1 value according to the correction coefficient.

9. The system of claim 7, wherein the determining, based at least in part on the correction coefficient, the T1 value of the subject comprises:
   determining a corrected first flip angle by correcting the first flip angle according to the correction coefficient; and
   determining the T1 value of the subject based on the corrected first flip angle, the second flip angle, and the target value of the reference coefficient.

10. The system of claim 1, wherein the determining, based at least in part on the target value of the reference coefficient, a T1 value of the subject is performed according to an analytic solution or a driven equilibrium single pulse observation (DESPOT) algorithm.

11. A method for magnetic resonance imaging (MRI) implemented on a computing device having at least one processor and at least one storage device, comprising:
   obtaining a first set of MRI data relating to a subject acquired by an MR scanner in a first acquisition when the subject reaches a first T1 weighting level, the first acquisition being applied according to one or more first values each of which corresponds to one of one or more pulse sequence parameters, wherein the one or more first values of the one or more pulse sequence parameters include a first flip angle;
   obtaining a second set of MRI data relating to the subject acquired by the MR scanner in a second acquisition when the subject reaches a second T1 weighting level different from the first T1 weighting level, the second acquisition being applied according to one or more second values each of which corresponds to one of the one or more pulse sequence parameters, the first value and the second value of at least one of the one or more pulse sequence parameters being different, wherein the one or more second values of the one or more pulse sequence parameters include a second flip angle different from the first flip angle; and
   determining, based on the first set of MRI data and the second set of MRI data, a target value of a reference coefficient associated with a first B1 inhomogeneity in the first acquisition and a second B1 inhomogeneity in the second acquisition.

12. The method of claim 11, wherein the subject is a physical point of an object, and the reference coefficient measures a difference between a first signal intensity at the physical point during the first acquisition and a second signal intensity at the physical point during the second acquisition.

13. The method of claim 12, wherein the reference coefficient is a ratio of the first signal intensity to the second signal intensity or a ratio of the second signal intensity to the first signal intensity.

14. The method of claim 11, wherein the operations further includes:
   determining, based at least in part on the target value of the reference coefficient, a T1 value of the subject.

15. The method of claim 14, wherein the determining, based at least in part on the target value of the reference coefficient, a T1 value of the subject comprises:
   determining, based on the one or more first values and the one or more second values of the one or more pulse sequence parameters, a reference value of the reference coefficient;
   determining, based on the reference value and the target value of the reference coefficient, a correction coefficient with respect to T1 measurement; and
   determining, based at least in part on the correction coefficient, the T1 value of the subject.

16. The method of claim 15, wherein the determining, based at least in part on the correction coefficient, the T1 value of the subject comprises:
   determining a preliminary T1 value of the subject based on the first flip angle, the second flip angle, and the reference value of the reference coefficient; and
   determining the T1 value of the subject by correcting the preliminary T1 value according to the correction coefficient.

17. The method of claim 15, wherein the determining, based at least in part on the correction coefficient, the T1 value of the subject comprises:
   determining a corrected first flip angle by correcting the first flip angle according to the correction coefficient; and
   determining the T1 value of the subject based on the corrected first flip angle, the second flip angle, and the target value of the reference coefficient.

18. A non-transitory computer readable medium, comprising a set of instructions for magnetic resonance imaging (MRI), wherein when executed by at least one processor, the set of instructions direct the at least one processor to effectuate a method, the method comprising:
   obtaining a first set of MRI data relating to a subject acquired by an MR scanner in a first acquisition when the subject reaches a first T1 weighting level, the first acquisition being applied according to one or more first values each of which corresponds to one of one or more pulse sequence parameters, wherein the one or more first values of the one or more pulse sequence parameters include a first flip angle;
   obtaining a second set of MRI data relating to the subject acquired by the MR scanner in a second acquisition when the subject reaches a second T1 weighting level different from the first T1 weighting level, the second acquisition being applied according to one or more second values each of which corresponds to one of the one or more pulse sequence parameters, the first value and the second value of at least one of the one or more pulse sequence parameters being different, wherein the one or more second values of the one or more pulse sequence parameters include a second flip angle different from the first flip angle; and
   determining, based on the first set of MRI data and the second set of MRI data, a target value of a reference coefficient associated with a first B1 inhomogeneity in the first acquisition and a second B1 inhomogeneity in the second acquisition.

* * * * *